United States Patent
Hashimoto et al.

(10) Patent No.: US 8,345,805 B2
(45) Date of Patent: Jan. 1, 2013

(54) RECEIVING CIRCUIT

(75) Inventors: Takeshi Hashimoto, Kanagawa (JP); Kazuhiro Ishida, Tokyo (JP)

(73) Assignee: NEC Corporation, Tokyo (JP)

( * ) Notice: Subject to any disclaimer, the term of this patent is extended or adjusted under 35 U.S.C. 154(b) by 746 days.

(21) Appl. No.: 12/289,737

(22) Filed: Nov. 3, 2008

(65) Prior Publication Data

US 2009/0135953 A1    May 28, 2009

(30) Foreign Application Priority Data

Nov. 27, 2007    (JP) ................................. 2007-306469

(51) Int. Cl.
- H03D 1/04 (2006.01)
- H03D 1/06 (2006.01)
- H03K 5/01 (2006.01)
- H03K 6/04 (2006.01)
- H04B 1/10 (2006.01)
- H04L 1/00 (2006.01)
- H04L 25/08 (2006.01)

(52) U.S. Cl. ............... 375/346; 700/28; 700/53; 710/56

(58) Field of Classification Search .................. 375/130, 375/132, 136, 140, 141, 147, 148, 316, 322, 375/325, 346, 349, 350; 700/1, 28, 53; 710/1, 710/52, 56; 370/464, 475–476

See application file for complete search history.

(56) References Cited

U.S. PATENT DOCUMENTS

| 6,744,744 | B1 | 6/2004 | Tong et al. |
| 6,798,826 | B1* | 9/2004 | Shiu et al. ..................... 375/147 |
| 7,187,708 | B1 | 3/2007 | Shiu et al. |
| 2004/0076184 | A1* | 4/2004 | Tene et al. ..................... 370/476 |
| 2005/0286612 | A1 | 12/2005 | Takanashi |
| 2008/0080542 | A1* | 4/2008 | Vishwanathan et al. ...... 370/412 |

FOREIGN PATENT DOCUMENTS

| EP | 1 045 521 A2 | 10/2000 |
| JP | 2004-515094(A) | 5/2004 |
| JP | 2006-14000 | 1/2006 |
| KR | 2003-0048126 A | 6/2003 |

OTHER PUBLICATIONS

Korean Office Action dated Sep. 14, 2010 with Japanese and partial English translation thereof.
Japanese Office Action issued Nov. 29, 2011 with a partial English translation thereof.

* cited by examiner

Primary Examiner — David C. Payne
Assistant Examiner — James M Perez
(74) Attorney, Agent, or Firm — McGinn IP Law Group, PLLC

(57) ABSTRACT

A receiving circuit includes a frame memory to store received data of one frame, a de-rate matching circuit to generate data before encoding by reading the received data from the frame memory and performing de-rate matching in a reverse manner to rate matching performed on the received data at a transmitting end, and a TTI memory to store the data before encoding.

15 Claims, 34 Drawing Sheets

RECEIVING CIRCUIT

BACKGROUND

1. Field of the Invention

The present invention relates to a receiving circuit and, particularly, to a receiving circuit that receives data on which data matching for equalizing data size of each frame has been performed at the transmitting end.

2. Description of Related Art

A semiconductor device that is mounted on a portable device such as a cellular phone needs to be small so as to achieve a small-size device. In order to achieve a small-size semiconductor device, it is necessary to reduce a circuit scale. In light of this, a technique to reduce the circuit scale of a de-interleaving device that is used in a receiving circuit, which is one of the semiconductor devices to be mounted on a portable device, is disclosed in Japanese Unexamined Patent Application Publication No. 2006-14000.

FIG. 22 shows the configuration of a de-interleaving device 200 described in Japanese Unexamined Patent Application Publication No. 2006-14000. A radio frame buffer 211 is a memory to store a radio frame that is input from the outside (e.g. a de-interleaver that is placed in the previous stage of the de-interleaving device 200 and performs de-interleaving before radio frame combining). The radio frame combiner 212 is a functional section to combine the radio frames stored in the radio frame buffer 211 to form a TTI frame, and it stores the formed TTI frame into a TTI frame buffer 213. Addition of a P-bit is not performed at this time, which is different from a de-interleaving device heretofore used.

A de-interleaver 214 reads the number of P-bits to be inserted into the TTI frame to be de-interleaved from a P-bit information table 215 and further reads a replacement rule from a replacement rule table 216, and then performs bit replacement on each bit of the TTI frame. The TTI frame after replacement is output to the outside of the de-interleaving device 200. Specifically, it is output to a decoding block for decoding the de-interleaved TTI frame.

In the technique disclosed in Japanese Unexamined Patent Application Publication No. 2006-14000, data after radio frame combining is stored in the TTI buffer. After that, de-interleaving is performed by the de-interleaver 214, and then de-rate matching is performed in the subsequent stage. The technique disclosed in Japanese Unexamined Patent Application Publication No. 2006-14000 reduces the capacity of the TTI frame buffer 213 by not adding a P-bit to the TTI frame buffer 213 at this time.

The present inventors, however, have found the following problem. If data is received according to 3GPP specifications, the received data contains data other than data to be decoded because of the rate matching performed at the transmitting end. Thus, de-rate matching, which is the processing reverse to the rate matching performed at the transmitting end, is performed at the receiving end in the 3GPP specifications. The data before the de-rate matching possibly becomes 6.6 times the maximum number of bits (the total of all TrCH) before encoding. It can thus become about 2 times at maximum (in the case of the encoding rate=⅓) the data after encoding, which is before the rate matching. Because the TTI frame buffer of the related art needs to store data before the de-rate matching as described above, it is required to have about two times the capacity of a necessary size as an input of a decoder, causing an increase in circuit scale.

SUMMARY

A first exemplary aspect of an embodiment of the present invention is a receiving circuit that includes a frame memory to store received data of one frame, a de-rate matching circuit to generate data before encoding by reading the received data from the frame memory and performing de-rate matching in a reverse manner to rate matching performed on the received data at a transmitting end, and a TTI memory to store the data before encoding.

In the receiving circuit according to the exemplary embodiment of the present invention, the received data after the de-rate matching is performed by the de-rate matching circuit is stored into the TTI memory. Thus, the TTI memory stores only data to be used for the subsequent decoding. Therefore, the TTI memory is only required to have a capacity enough to store the data to be used for the decoding.

According to the embodiment of the present invention, it is possible to reduce the capacity of the TTI memory to store undecoded data.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The first to fifth exemplary embodiments can be combined as desirable by one of ordinary skill in the art. The exemplary embodiments of the present invention are described hereinafter in detail with reference to the drawings. In the following exemplary embodiments, the present invention is applied to a decoding circuit that performs data size adjustment (rate matching).

First Exemplary Embodiment

Figure 1:
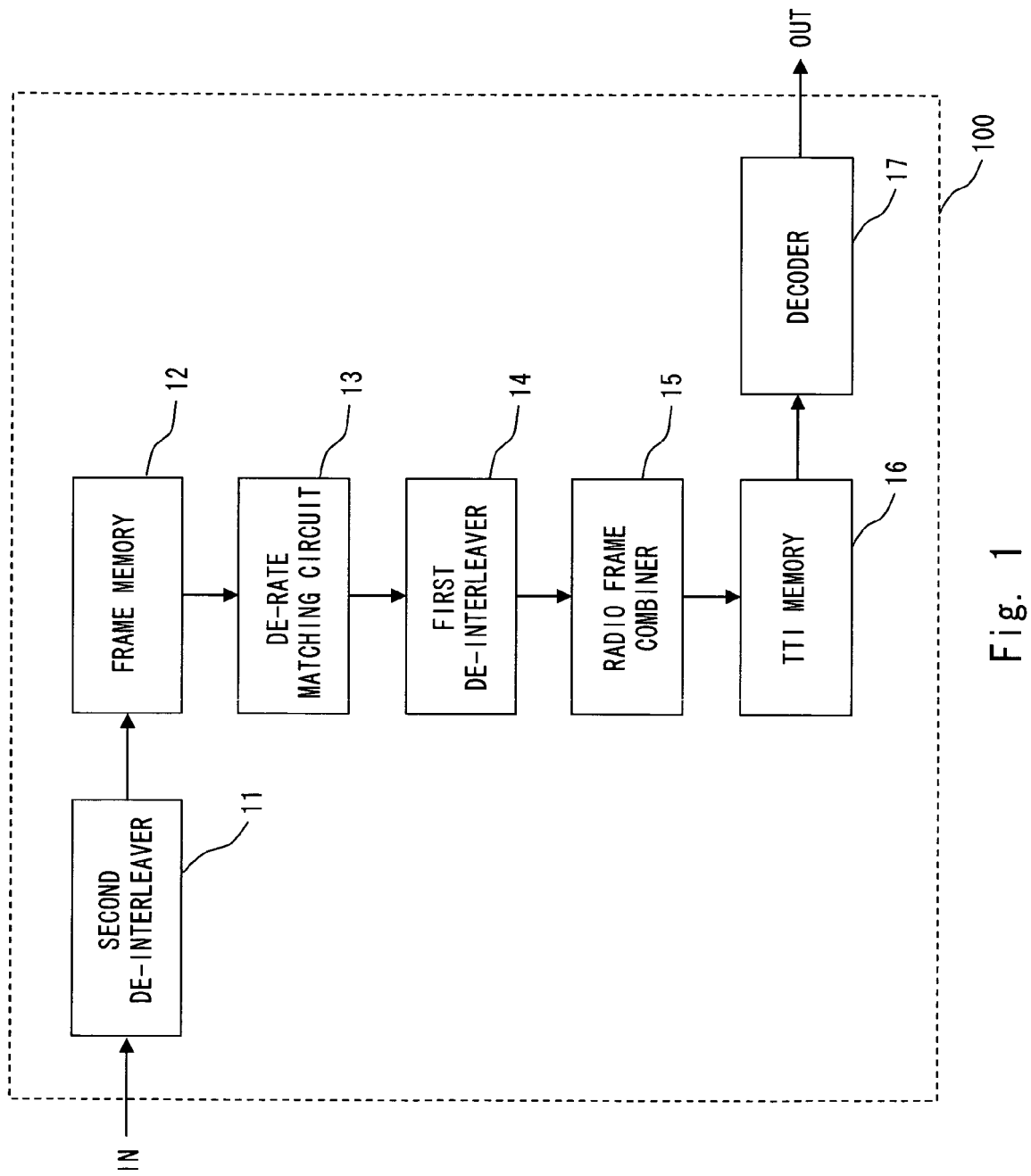
FIG. 1 is a block diagram of a receiving circuit according to a first exemplary embodiment of the present invention.

FIG. 1 is a view showing a receiving circuit 100 according to a first exemplary embodiment of the present invention. A data transmission procedure in a down channel (a communication channel in the direction from a base station to a terminal) is described hereinafter as an example. Data is processed in a unit called a transport channel (TrCH). In the end, the transport channel is mapped into a channel called a physical channel (PhCH) according to the procedure described in 3GPP TS25.212, and output to a wireless transmission channel after diffusion. The physical channel contains data obtained by dividing the transport channel. The physical channel is processed in a unit called a radio frame (which is hereinafter referred to simply as a frame unit in some cases). The number of data contained in one frame of the physical channel is semi-fixed in 3GPP TS25.212. On the other hand, the number of data in the transport channel is arbitrary.

The receiving circuit 100 receives data in units of frames, performs rate matching in units of frames, and then combines radio frames to generate a transport channel, which is unde-coded data. The receiving circuit 100 includes a second de-interleaver 11, a frame memory 12, a de-rate matching circuit 13, a first de-interleaver 14, a radio frame combiner 15, a TTI memory 16, and a decoder 17.

The data received in the receiving circuit 100 is stored for second de-interleaving and input to the second de-interleaver 11 as received data IN. The second de-interleaver 11 de-interleaves the received data IN with use of a dedicated address generator. The frame memory 12 stores data of one frame. The de-rate matching circuit 13 performs de-rate matching on the data de-interleaved by the second de-interleaver 11. The de-rate matching is processing reverse to rate matching performed at the transmitting end. The rate matching is processing to add data to or delete data from transmission data so as to make the size of the transmission data match a radio frame unit. The detail of the de-rate matching is described later. The frame data after the de-rate matching is then de-interleaved by the first de-interleaver 14. The frame data de-interleaved by first de-interleaver 14 is combined with another frame data by the radio frame combiner 15 and stored into the TTI memory 16. In the TTI memory 16, the data of one transport channel is stored as data before decoding. The decoder 17 retrieves the data before decoding of one transport channel that is stored in the TTI memory 16, decodes it and outputs the decoded data.

In this exemplary embodiment, the de-rate matching is performed before storing data into the TTI memory 16 in order to reduce the TTI memory size. Because data after the de-rate matching is stored into the TTI memory 16, it is possible to reduce the size of the TTI memory 16. Thus, the de-rate matching performed for each frame in this exemplary embodiment.

Figure 2:
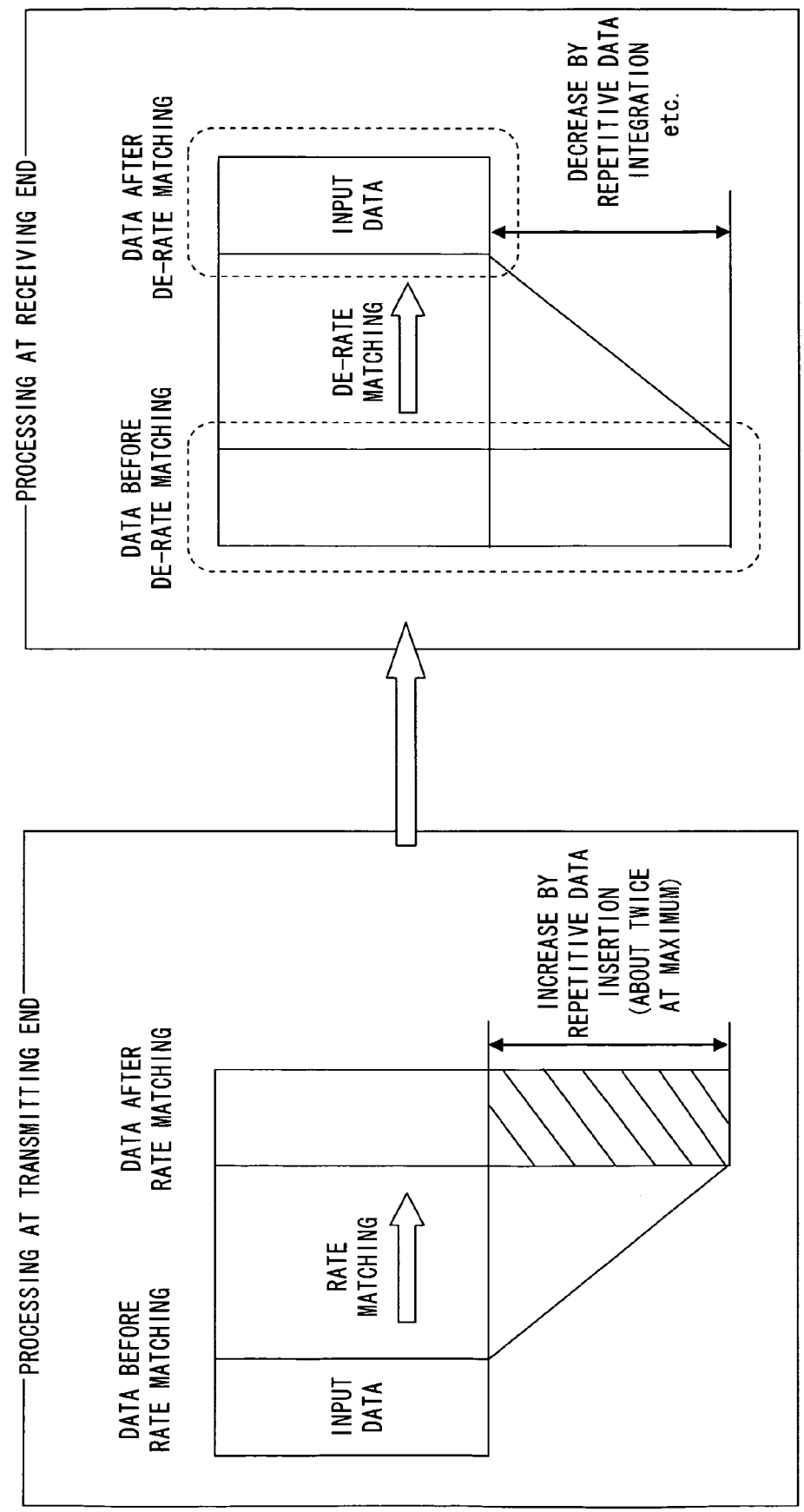
FIG. 2 is a view showing a relationship between the amount of data that increases by rate matching at the transmitting end and the amount of data that decreases by de-rate matching at the receiving end.

FIG. 2 is a conceptual diagram showing an increase in the amount of data by the rate matching at the transmitting end and a decrease in the amount of data by the de-rate matching at the receiving end. As shown in the left part of FIG. 2, the amount of data increases to about two times by the rate matching at the transmitting end. On the other hand, as shown in the right part of FIG. 2, as a result of the de-rate matching at the receiving end, the data that has increased by the rate-matching is deleted, so that the amount of data decreases to about ½. Because the TTI memory of the related art needs to store the data that has increased by the rate-matching in addition to the input data, it is required to have the capacity of about two times the data to be actually decoded. However, data to be input to the decoder is only the data after the de-rate matching. If the de-rate matching is performed after storing the received data into the TTI memory, the TTI memory has an unnecessary memory size that is not used for decoding, which causes an increase in the capacity of the TTI memory. To avoid this, according to the exemplary embodiment, the de-rate matching is performed in the de-rate matching circuit 13, so that the data stored into the TTI memory 16 becomes only the necessary undecoded data as a result of repetitive data integration or the like. Specifically, in the case of receiving 384 kbps packet data, although the TTI memory of a maximum 59 kw is required in the related art, it is reduced to 30 kw in this exemplary embodiment.

The data of a transport channel as an input to the rate matching is formed by adding CRC to transmission data, performing transport block (TrBk) coupling and encoding block dividing, and further performing channel encoding. Although all TrBk are coupled continuously, it is divided into encoding blocks when exceeding a prescribed size. The size of an encoding block is determined based on an encoding rate of an encoding method used for channel encoding. A difference in data size due to a difference in encoding rate is described below.

Figure 3:
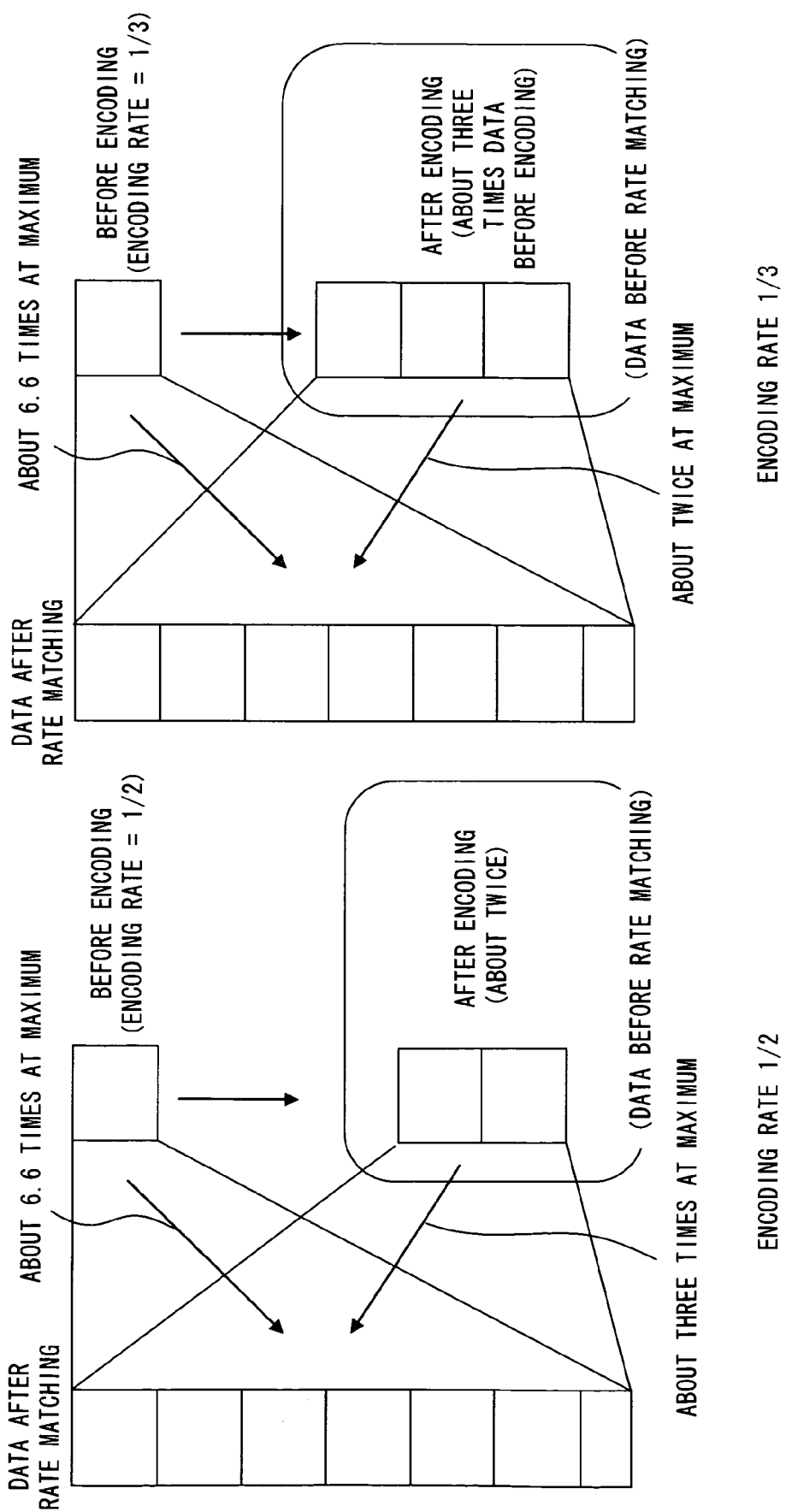
FIG. 3 is a view showing a comparison of an increase in data size between the encoding rate of ⅓ and the encoding rate of ½.

FIG. 3 is a view showing a comparison of an increase in data size between the encoding rate of ⅓ and the encoding rate of ½. In the channel encoding, an encoding method and an encoding rate differ by the type of a transport channel. When considering a maximum value of a data size after rate matching, the encoding rate is dominant. For example, if the encoding rate is ½, the data before rate matching is about two times as shown in the left part of FIG. 3. On the contrary, if the encoding rate is ⅓, the data before rate matching is about three times the data before encoding as shown in the right part of FIG. 3. Thus, the data size after rate matching is about two times that before rate matching. This corresponds to the case where the data size after de-rate matching is ½ that before de-rate matching, which means that the capacity of the TTI memory is reduced to about ½.

The rate matching performed at the transmitting end is described hereinbelow. Although the rate matching is described below, the de-rate matching is processing that is performed at the receiving end, which is reverse to the rate matching. The processing unit of a physical channel is a unit called a radio frame. The number of data in one frame of the physical channel is semi-fixed in 3GPP TS25.212. On the other hand, the size of a transport channel is arbitrary, and therefore the transport channel does not necessarily correspond to the number of bits of one radio frame of the physical channel. The rate matching is processing for eliminating a difference between the number of data in the transport channel and the number of data in the radio frame. Further, insertion of data called discontinuous transmission (DTX) or the like is also performed, and the rate matching is performed in combination with such processing.

There are two methods for the rate matching, data elimination and data repetitive insertion, depending on the relationship in size between the number of data in the transport channel and the number of data in the radio frame.

Figure 4:
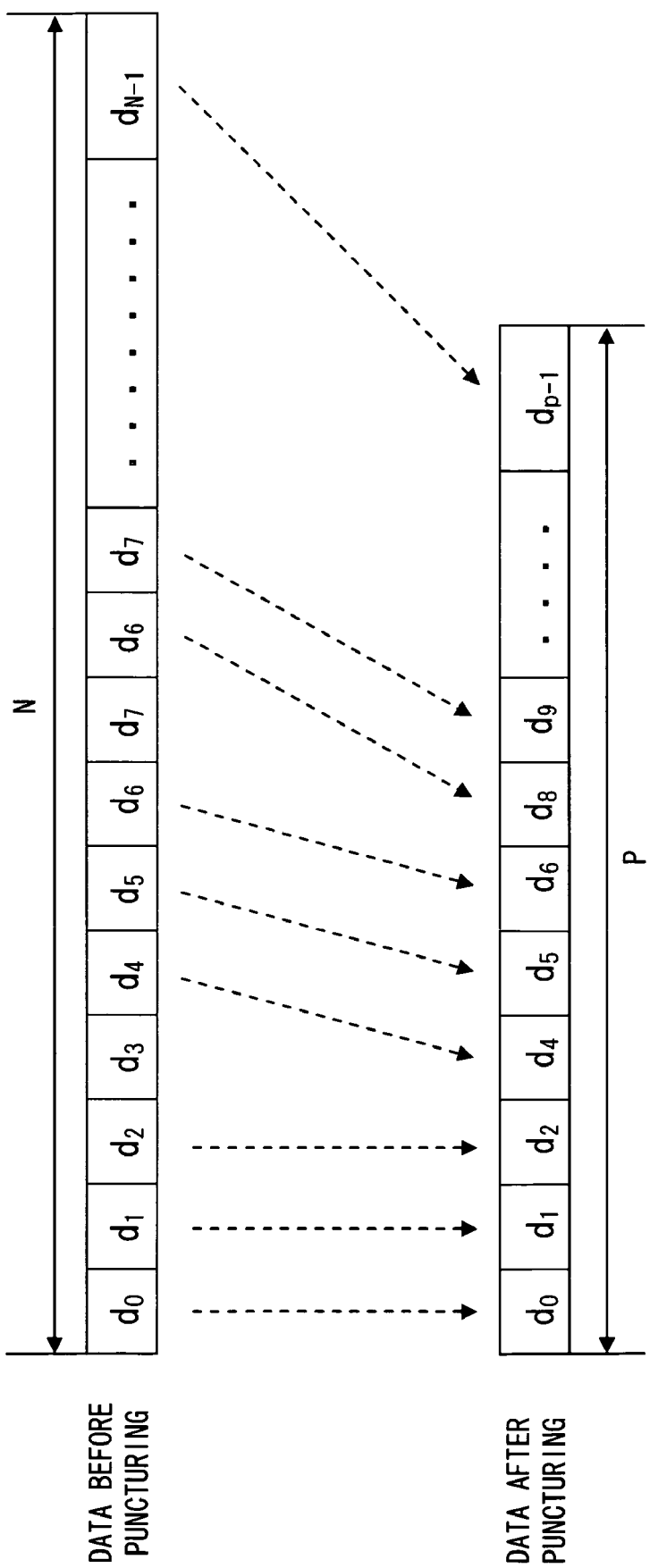
FIG. 4 is a view showing an example of data elimination processing by the rate matching at the transmitting end.

First, the data elimination (puncturing) processing that is performed in the case of "the number of data in the transport channel>the number of data in the radio frame" is described hereinafter. FIG. 4 is a view to explain the data elimination processing. In the data elimination processing, data is eliminated at a prescribed data interval from the N-number of data before puncturing processing shown in the upper part of FIG. 4, so that data after puncturing shown in the lower part of FIG. 4 is generated. In the example of FIG. 4, every four pieces of data (e.g. data $d_3$, $d_7$ etc.) is eliminated so as to reduce the data from the N-number of data to the P-number of data. If such puncturing is performed at the transmitting end, repetitive insertion of data into the portion from which the data is eliminated is performed in de-rate matching at the receiving end.

Figure 5:
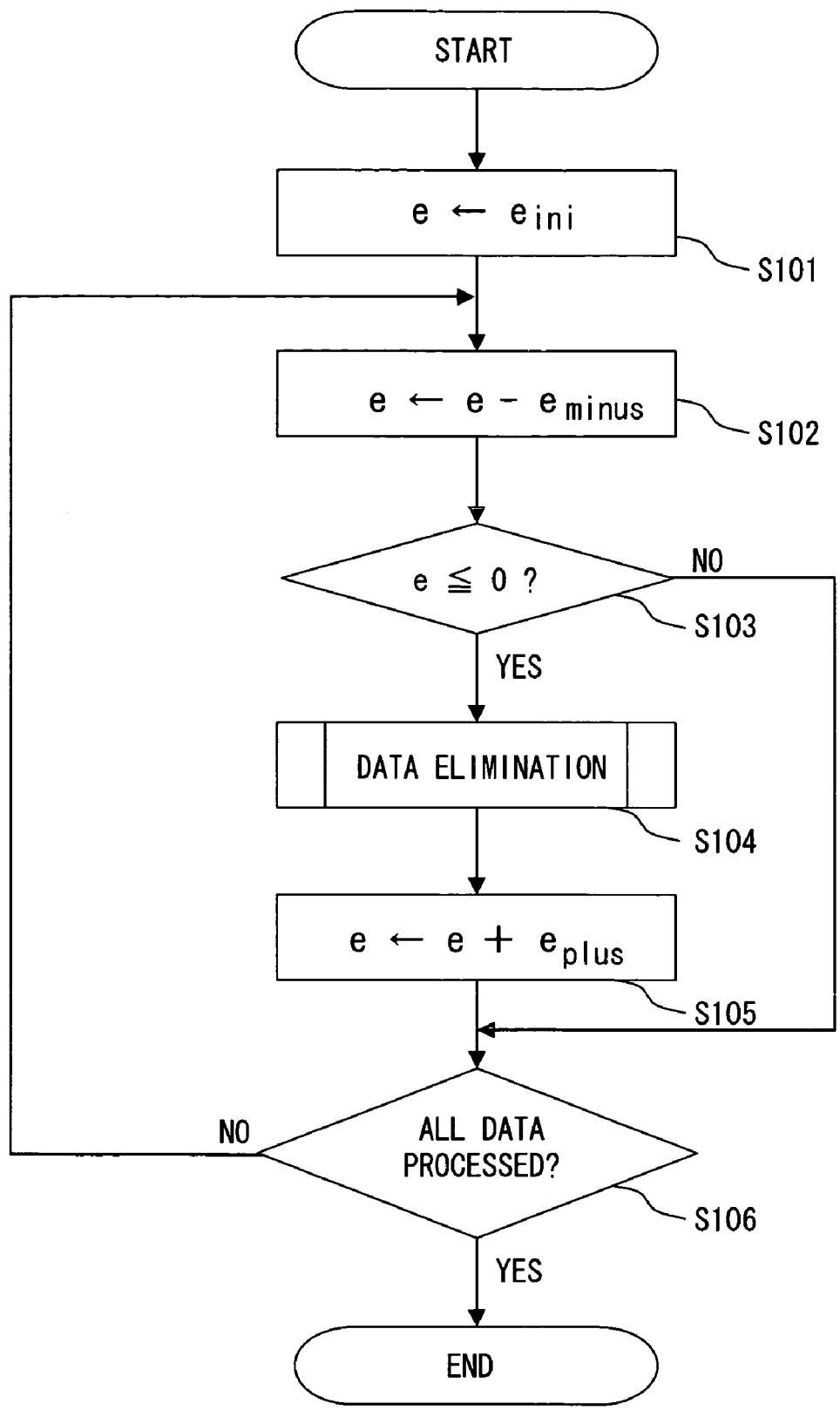
FIG. 5 is a flowchart showing data elimination processing in the rate matching at the transmitting end.

FIG. 5 is a flowchart showing the data elimination processing in the rate matching. In FIG. 5, "e" is a parameter that indicates the position of data to be eliminated in a data row. "$e_{ini}$" is an initial value of the parameter e, "$e_{plus}$" is the amount of an increase in the parameter e, and "$e_{minus}$" is the amount of a decrease in the parameter e. "$e_{ini}$", "$e_{minus}$" and "$e_{plus}$" are transmitted to the receiving end and used for the de-rate matching at the receiving end. "$e_{ini}$", "$e_{minus}$" and "$e_{plus}$" are transmitted to the receiving end through a different path from received data to be processed in the de-rate matching circuit 13.

Referring to FIG. 5, in the data elimination processing, the parameter e is initialized first (S101). Next, the parameter e is decremented by "$e_{minus}$" (S102). Then, it is determined whether the decremented parameter e is equal to or smaller than 0 (S103). If the value of the parameter e is equal to or smaller than 0 in the step S103 (Yes in S103), the data elimination is executed (S104). Further, the parameter e is incremented by "$e_{plus}$" to generate the parameter e for the next cycle (S105). After that, it is determined whether determination on data elimination is performed on all received data, and if unprocessed data remains, the process returns to the step S102 (No in S106). If it is determined in S106 that determination on data elimination is performed on all received data, the process ends (Yes in S106). On the other hand, if the value of the parameter e is larger than 0 in the step S103 (No in S103), the process proceeds to S106 without performing the data elimination.

Figure 6:
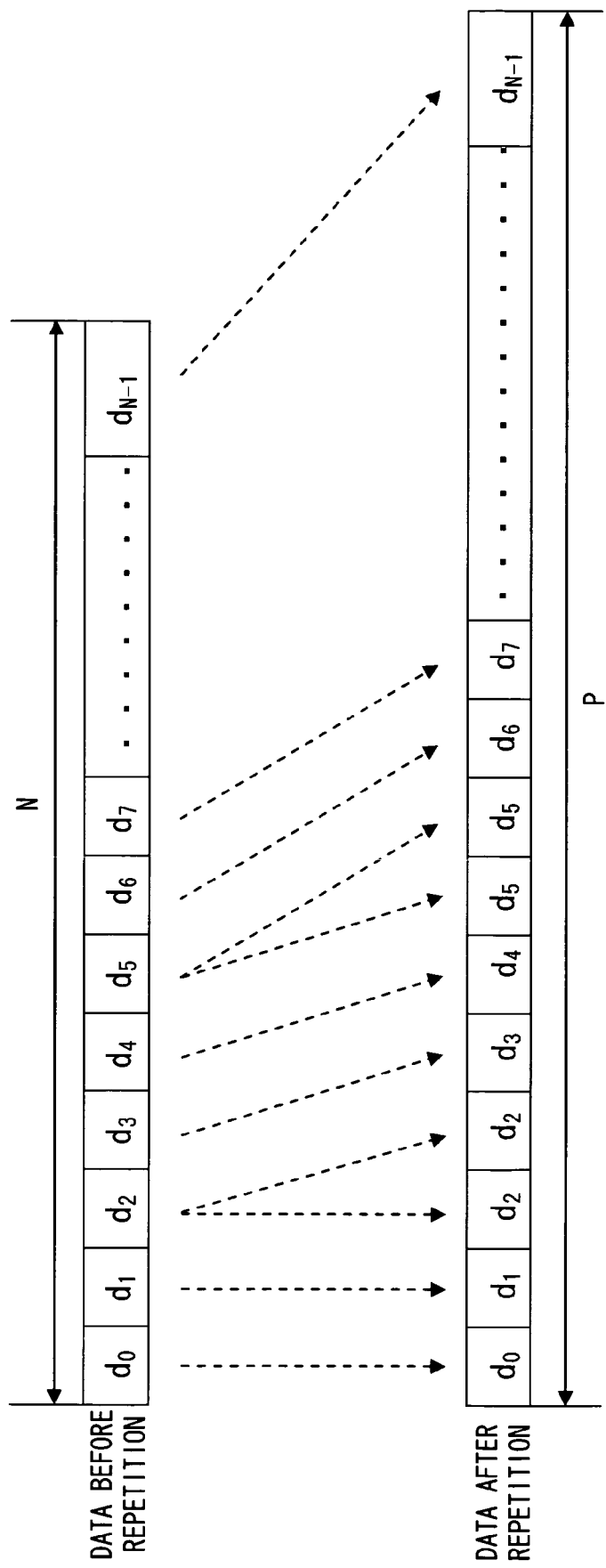
FIG. 6 is a view showing an example of data repetitive insertion processing by the rate matching at the transmitting end.
Figure 7:
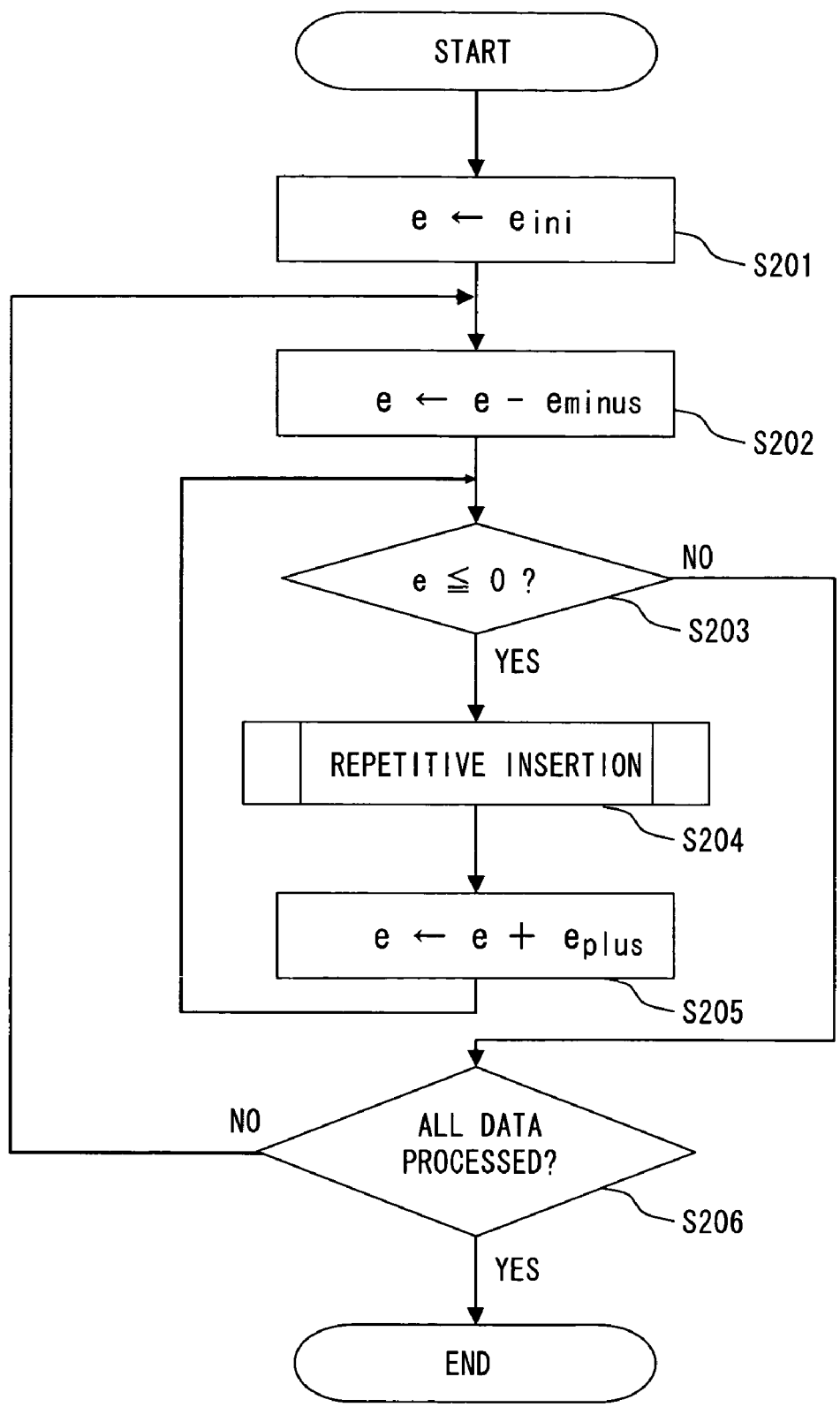
FIG. 7 is a flowchart showing data repetitive insertion processing in the rate matching at the transmitting end.

Next, the data repetitive insertion (repetation) processing that is performed in the case of "the number of data in the transport channel<the number of data in the radio frame" is described hereinafter. FIG. 6 is a view showing an example of data on which repetitive insertion processing is performed by the rate matching. FIG. 7 is a flowchart showing the data repetitive insertion-processing in the rate matching. In the data repetitive insertion processing, insertion data is repeatedly inserted into the N-number of data shown in the upper part of FIG. 6, so that the P-number of data shown in the lower part of FIG. 6 is generated. In this example, $d_2$ and $d_5$ are repeatedly inserted, like $d_0$, $d_1$, $d_2$, $d_2$, $d_3$, $d_4$, $d_5$, $d_5$, $d_6$ and so on.

Referring to FIG. 7, in the data repetitive insertion processing, the parameter e is initialized first (S201). Next, the parameter e is decremented by "$e_{minus}$" (S202). Then, it is determined whether the decremented parameter e is equal to or smaller than 0 (S203). If the value of the parameter e is equal to or smaller than 0 in the step S203 (Yes in S203), the data insertion is executed (S204). Further, the parameter e is incremented by "$e_{plus}$" to generate the parameter e for the next cycle (S205), and the process returns to the step S203. Then, if the value of the parameter e is larger than 0 as a result of the determination in the step S203 performed again (No in S203), the process proceeds to the step S206. In the step S206, it is determined whether determination on data repetitive insertion is performed on all received data, and if unprocessed data remains, the process returns to the step S202 (No in S206). If it is determined in S206 that determination on data repetitive insertion is performed on all received data, the process ends (Yes in S206).

Although the case where one transport channel is mapped into a physical channel is described above for simplification, one transport channel may be divided into a plurality of pieces and transmitted by a plurality of radio frames. The number of divisions is 1, 2, 4, or 8. Further, a plurality of transport channels may be multiplexed onto one radio frame and transmitted. A period during which one transport channel is transmitted is called a transmission time interval (TTI). For example, if a transport channel is transmitted by two radio frames, the TTI of the transport channel is two frames.

In the case where a plurality of transport channels are multiplexed and mapped into a radio frame, it is the number of data when data of each transport channel is divided into data of one frame and multiplexed. However, the rate matching is performed in units of transport channels.

Although the rate matching processing performed at the transmitting end is described in the foregoing, the de-rate matching circuit 13 according to the exemplary embodiment performs processing reverse to the above-described processing. Specifically, if data on which the data elimination has been performed at the transmitting end is received, the de-rate matching circuit 13 performs the processing to write puncture data into the eliminated data portion based on the above-described data elimination process flow as a basic flow. The puncture data has an intermediate value (e.g. 0). The processing performed in the de-rate matching circuit 13 according to the data elimination process flow at the transmitting end is referred to hereinafter as receiving-end data insertion processing. On the other hand, if data on which the data repetitive insertion has been performed at the transmitting end is received, the de-rate matching circuit 13 performs the processing to eliminate the inserted data based on the above-described data repetitive insertion process flow as a basic flow. The processing performed in the de-rate matching circuit 13 according to the data repetitive insertion process flow at the transmitting end is referred to hereinafter as receiving-end data deletion processing.

Because the de-rate matching processing in this exemplary embodiment is performed before combining radio frames, it is processed in units of frames. Thus, the de-rate matching circuit 13 according to the exemplary embodiment performs the de-rate matching in units of frames. Accordingly, the receiving-end data insertion and the receiving-end data deletion that are performed in the de-rate matching circuit 13 are different operation from the data elimination and the data repetitive insertion described above. The de-rate matching processing performed in the exemplary embodiment of the present invention is described hereinafter.

Figure 8:
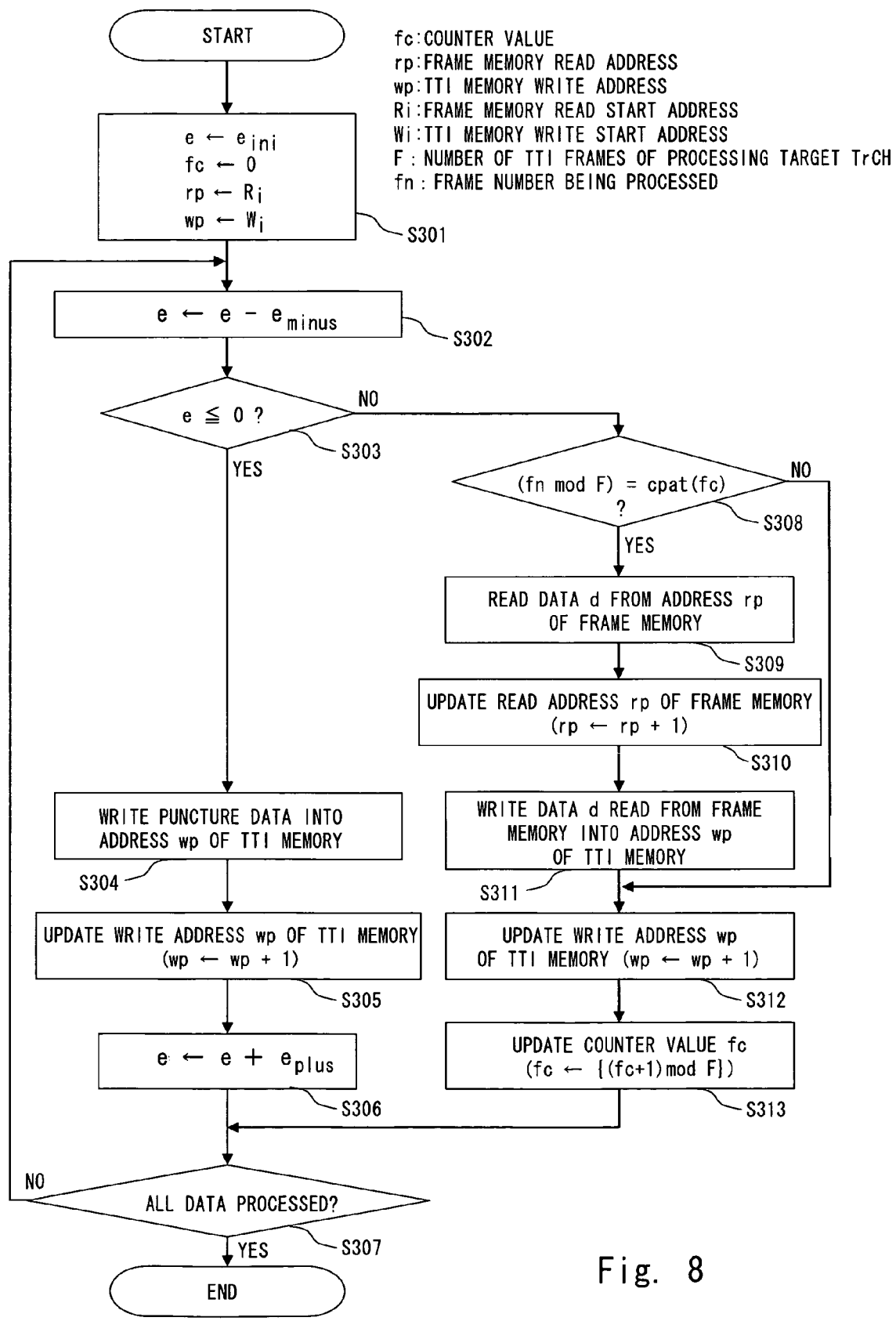
FIG. 8 is a flowchart showing receiving-end data insertion processing performed in a de-rate matching circuit according to the first exemplary embodiment of the present invention.

FIGS. 8 and 9 are flowcharts showing the de-rate matching processing according to the exemplary embodiment. In this exemplary embodiment, when performing the de-rate matching on each frame, the de-rate matching circuit 13 needs to identify what number of frame in the TTI of the transport channel to be processed is being processed. A frame number is used as a means for that end. The frame number is notified from a higher-level layer before the de-rate matching is carried out. The frame number may be notified via a processing section in the previous stage.

In this exemplary embodiment, the frame being processed is identified with use of a first de-interleaving pattern (e.g. cpat(x)) indicating a row interchange pattern of the first de-interleaving. cpat(x) indicates a row interchange pattern of the first de-interleaving, and it is specified as follows according to the number of TTIs of the transport channel.

(1) TTI=1 frame; cpat(x)={0}
(2) TTI=2 frames; cpat(x)={0, 1}
(3) TTI=4 frames; cpat(x)={0, 2, 1, 3}
(4) TTI=8 frames; cpat(x)={0, 4, 2, 6, 1, 5, 3, 7}

In this exemplary embodiment, because the first de-interleaver 14 is placed in the subsequent stage of the de-rate matching circuit 13, it is necessary to perform the de-rate matching according to the sequence of the de-interleaving to be performed by the first de-interleaver 14. Thus, the process flow described hereinafter involves a flow to determine a frame to be processed based on the value of cpat(x). Specifically, the process determines whether the frame being processed is a frame that should be processed or not based on the value of cpat (fc) (which is referred to hereinafter as a processing determination frame number) obtained by substituting a counter value fc indicating the input order of the frame into x in cpat(x) and the frame number being processed. For example, when the number of TTI frames is 4 and the counter value fc is 0, the processing determination frame number cpat (fc) is 0. Further, when the counter value fc is 1, the processing determination frame number cpat (fc) is 2. Based on the processing determination frame number, if the processing determination frame number is 2 and the frame number of the frame being input is 2, for example, the de-rate matching is performed on the frame. The frame number indicates the position of the frame in the transport channel, not indicating the input order of the frame.

The receiving-end data insertion processing is described hereinafter with reference to FIG. 8. Referring to FIG. 8, in the receiving-end data insertion processing, each parameter to be used for processing is initialized first (S301). Specifically, the parameter e is set to $e_{ini}$, the frame counter fc is set to 0, a read address rp of the frame memory 12 is set to a read start address $R_i$ of the frame memory 12, and a write address wp of the TTI memory 16 is set to a write start address $W_i$ of the TTI memory 16.

Next, the parameter e is decremented by "$e_{minus}$" (S302). Then, it is determined whether the decremented parameter e is equal to or smaller than 0 (S303). If the parameter e is equal to or smaller than 0 in the step S303 (Yes in S303), puncture data is written into the address wp of the TTI memory 16 (S304). In the next step S305, the write address wp of the TTI memory 16 is updated (e.g. wp←wp+1). Then, the parameter e is incremented by "$e_{plus}$" (S306).

On the other hand, if the parameter e is larger than 0 in the step S303 (No in S303), it is determined whether the frame being processed is a frame to be currently processed or not (S308). Specifically, it is determined whether the value indicated by cpat (fc) and the value obtained by dividing the frame number fn indicated by the frame being processed by the number F of TTI frames match or not. If it is determined in the step S308 that the two values match (Yes in S308), data is read from the read address rp of the frame memory 12 (S309). Then, the read address rp of the frame memory 12 is updated (e.g. rp←rp+1) (S310). Further, the data read from the frame memory 12 is written into the address wp of the TTI memory 16 (S311). On the other hand, if it is determined in the step S308 that the two values do not match (No in S308), the process skips the steps S309 to S311 and proceeds to the following step. In the following step S312, the write address wp of the TTI memory 16 is updated (e.g. wp←wp+1). Then, the frame counter fc is updated (S313). In the updating, a value obtained by adding 1 to the current counter value fc and dividing (fc+1) by the number F of TTI frames is set as the next counter value fc.

After the steps S306 and S313, if the above processing has been performed on all data contained in the frame being processed (Yes in S307), the process ends. If not (No in S307), the process repeats the processing from the step S302.

Figure 9A:
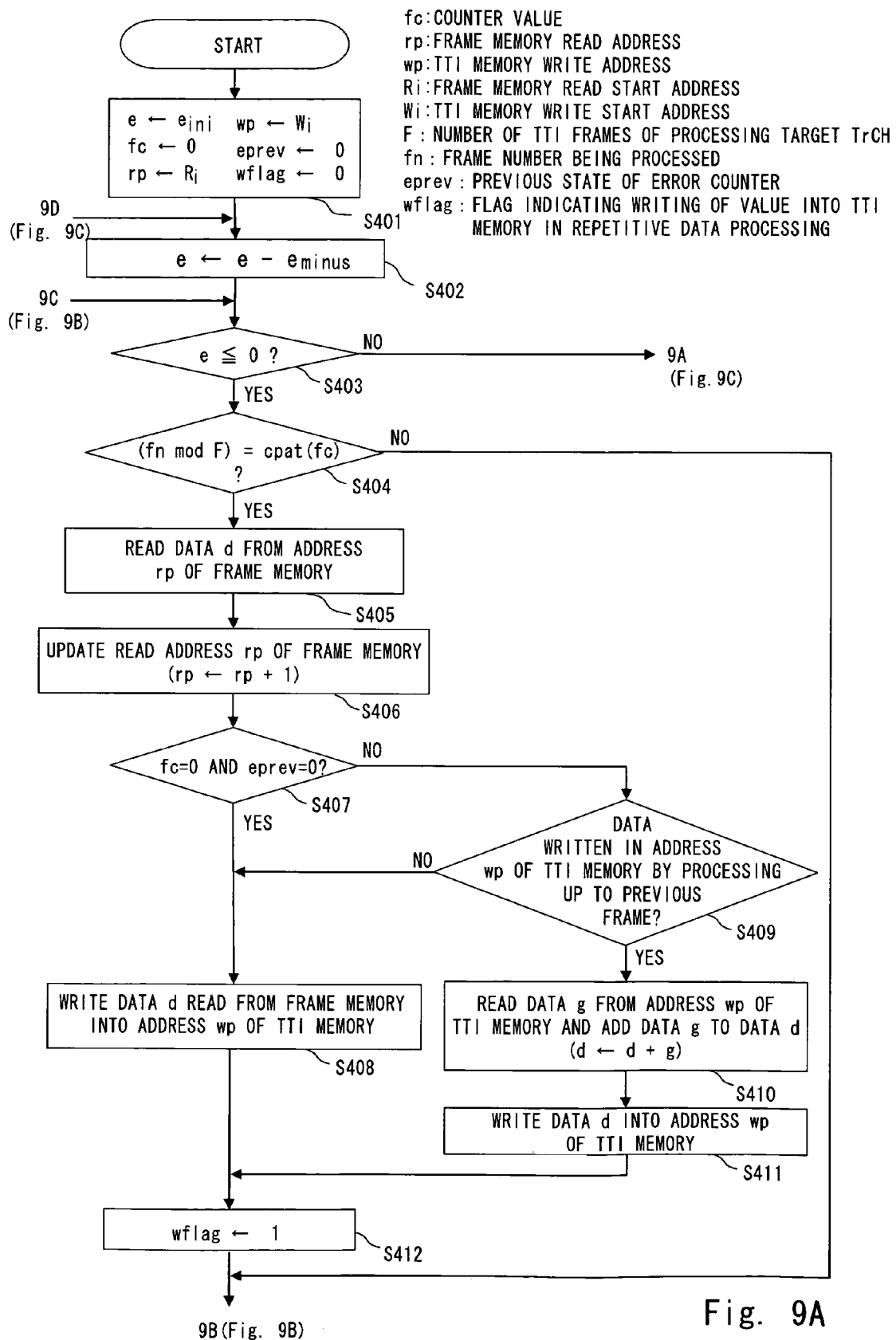
FIG. 9A is a flowchart showing receiving-end data deletion processing performed in the de-rate matching circuit according to the first exemplary embodiment of the present invention.
Figure 9B:
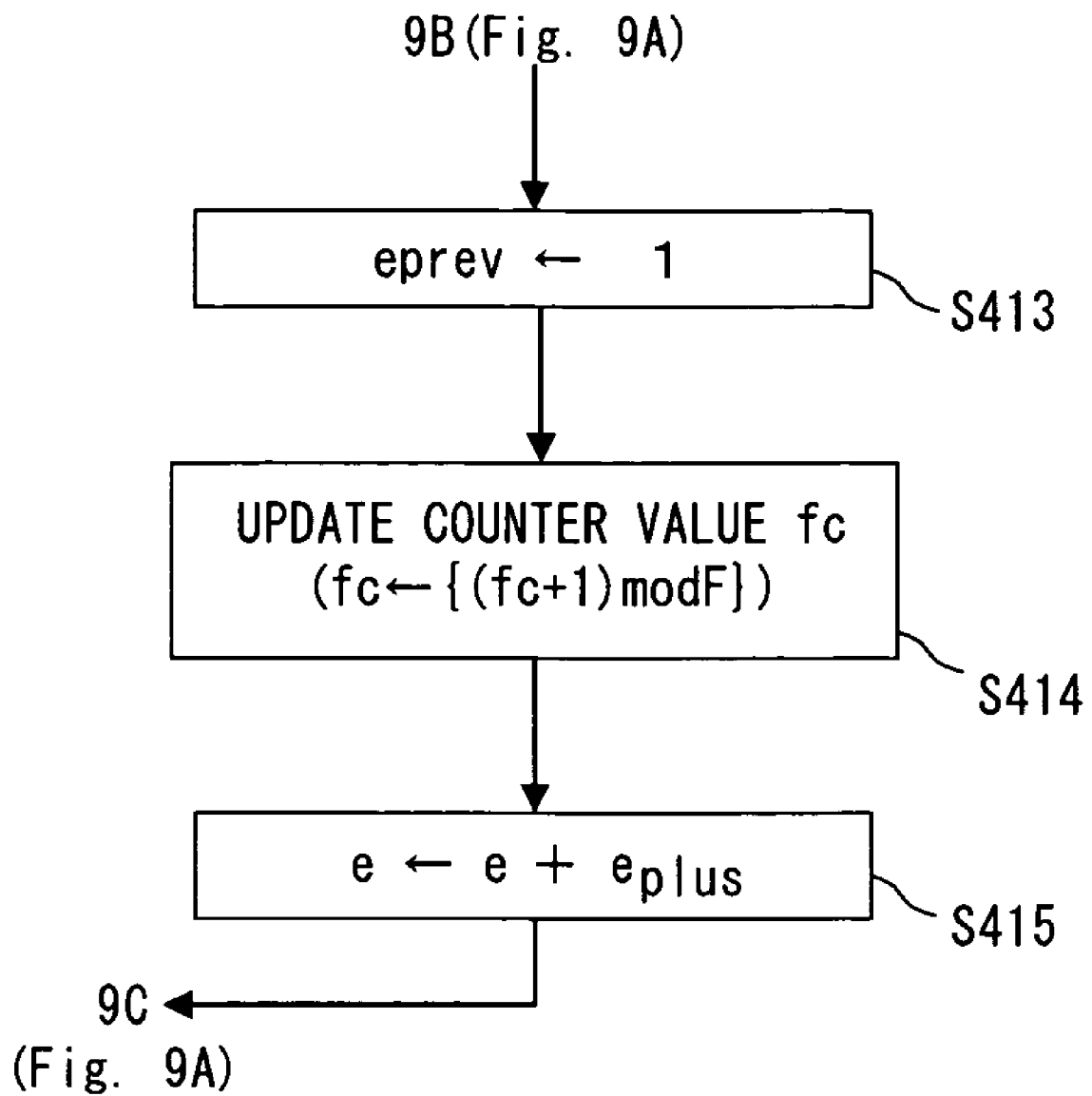
FIG. 9B is also a flowchart showing receiving-end data deletion processing performed in the de-rate matching circuit according to the first exemplary embodiment of the present invention.
Figure 9C:
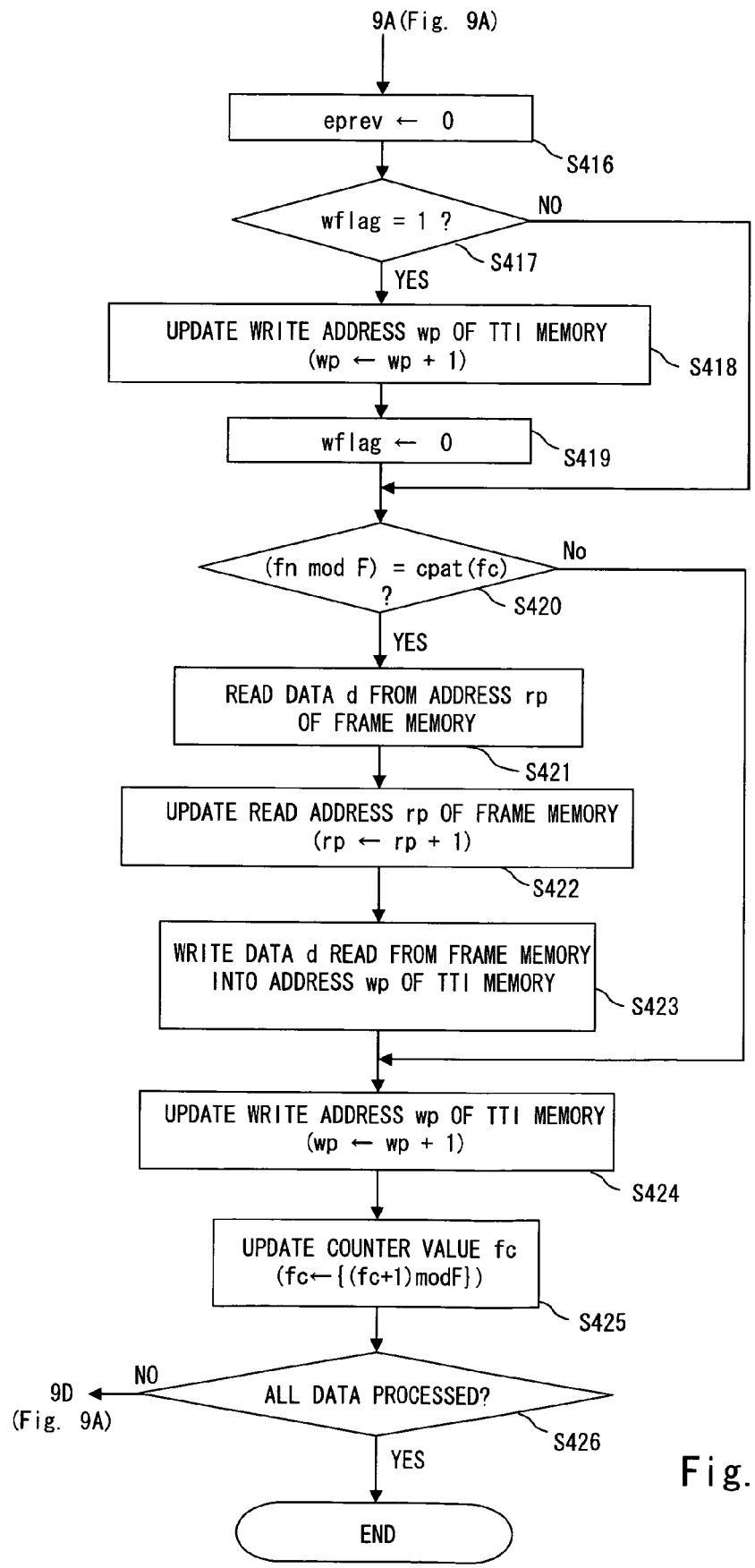
FIG. 9C is also a flowchart showing receiving-end data deletion processing performed in the de-rate matching circuit according to the first exemplary embodiment of the present invention.

The receiving-end data deletion processing is described hereinafter with reference to FIGS. 9A to 9C. Referring to FIGS. 9A to 9C, each parameter to be used for processing is initialized first (S401). Specifically, the parameter e is set to $e_{ini}$, the frame counter fc is set to 0, the read address rp of frame memory 12 is set to the read start address $R_i$ of the frame memory 12, and the write address wp of the TTI memory 16 is set to the write start address $W_i$ of the TTI memory 16. Further, eprev indicating the previous error counter status is set to 0, and a flag wflag indicating that a value is written into the TTI memory 16 in repetitive data processing is set to 0. The flag wflag of 1 indicates that writing is performed, and the flag wflag of 0 indicates that writing is not performed.

Next, the parameter e is decremented by "$e_{minus}$" (S402). Then, it is determined whether the decremented parameter e is equal to or smaller than 0 (S403). If the parameter e is equal to or smaller than 0, it is further determined whether the frame being processed is a frame to be currently processed or not (S404). This processing corresponds to the processing of the step S308 described above. If it is determined in the step S404 that the two values match (Yes in S404), data d is read from the read address rp of the frame memory 12 (S405). Then, the read address rp of the frame memory 12 is updated (e.g. rp←rp+1) (S406). After that, it is determined whether fc=0 and eprev=0 are satisfied (S407). If it is determined in the step S407 that fc=0 and eprev=0 are satisfied, the data d read from the frame memory 12 is written into the address wp of the TTI memory 16 (S408). On the other hand, it is determined that fc=0 and eprev=0 are not satisfied, it is further determined whether data has been written into the address wp of the TTI memory 16 by the processing up to the previous frame (S409). If it is determined in the step S409 that data has been written (Yes in S409), the data g is read from the address wp of the TTI memory 16 and added to the data d read from the frame memory 12 (d←d+g) (S410). Then, the data d is written into the address wp of the TTI memory 16 (S411). If, on the other hand, it is determined in the step S409 that data has not been written (No in S409), the process proceeds to the step S408. After the step S408 or the step S410, the flag wflag is set to 1 (S412).

After that, the eprev indicating the previous error counter status is set to 1 (S413). Then, the counter value fc is updated (S414). The updating of the counter value in the step S414 corresponds to the processing of the step S313 described above. Then, the parameter e is incremented by "$e_{plus}$" (S415), and the process returns to the step S403. On the other hand, if it is determined in the step S404 that the two values do not match (No in S404), the process skips the steps S405 to S412 and proceeds to execute the processing of the step S413.

On the other hand, if the parameter e is larger than 0 in the step S403, the eprev indicating the previous error counter status is set to 0 (S416). Then, it is determined whether the flag wflag is 1 (S417). If the flag wflag is 1 indicating that writing is performed, the write address wp of the TTI memory 16 is updated (e.g. wp←wp+1) (S418). After that, the flag wflag is set back to 0 (S419). If, on the other hand, it is determined in S417 that the flag wflag is 0, the process skips the steps S418 and S419 and proceeds to the following step. In the following step S420, it is determined whether the frame being processed is a frame to be currently processed or not (S420). This processing corresponds to the processing of the step S308 described earlier. If it is determined in the step S420 that the frame being processed is a frame to be processed (Yes in S420), the data d is read from the address rp of the frame memory 12 (S421). Then, the read address rp of the frame memory 12 is updated (e.g. rp←rp+1) (S422). After that, the data d read from the frame memory 12 is written into the address wp of the TTI memory 16 (S423). On the other hand, if it is determined in the step S420 that the frame being processed is different from a frame to be processed, the process skips the steps S421 to S423 and proceeds to the processing of the step S424. In the step S424, the write address wp of the TTI memory 16 is updated (e.g. wp←wp+1). Then, the frame counter fc is updated (S425). The updating of the counter value in the step S425 corresponds to the processing of the step S313 described earlier. After the step S425, if the above processing has been performed on all data contained in the frame being processed (Yes in S426), the process ends. If not (No in S426), the process repeats the processing from the step S402.

The first de-interleaving processing according to this exemplary embodiment is described hereinafter. The first de-interleaving processing according to the exemplary embodiment is implemented by applying the row interchange pattern in the first de-interleaving to the frame number being processed in the processing frame determination processing during the de-rate matching. This is carried out in the timings of the step S308 in FIG. 8 and the steps S404 and S420 in FIG. 9.

A specific example is described hereinafter using the case where the data after rate matching is divided into the frame 1 to the frame 4 by way of illustration. The data after rate matching d(0,0), d(1,0), d(2,0), d(3,0) and so on are respectively allocated to the frame 1, the frame 2, the frame 3, the frame 4 and so on. The first de-interleaving is performed by interchanging the frame 2 and the frame 3, for example. In the de-rate matching at the receiving end, the frames 1 and 4 are processed as the frames 1 and 4, the interchanged frame 2 is processed as the frame 3, and the interchanged frame 3 is processed as the frame 2.

The radio frame combining processing is performed by controlling the write start address when writing data into the TTI memory after executing a series of processing. On the transport channel as a processing target, processing is performed a several times in the TTI frame, and the de-rate matching of the transport channel is completed.

As described in the foregoing, the receiving circuit 100 according to the exemplary embodiment performs the de-rate matching on the received data before writing the received data into the TTI memory 16. It is thereby possible to eliminate the data added by the rate matching performed at the transmitting end before the data is written into the TTI memory 16. Therefore, the TTI memory 16 only needs to have a capacity enough to store undecoded data to be input to the decoder 17 without taking an increase in data due to the rate matching performed at the transmitting end into consideration. Thus, the receiving circuit 100 according to the exemplary embodiment of the present invention can reduce the capacity of the TTI memory 16 compared with a receiving circuit according to the related art and thereby minimize the circuit area of the TTI memory 16.

Further, the receiving circuit 100 according to the exemplary embodiment performs the de-rate matching in units of frames. However, because the first de-interleaver 14 is placed in the next stage of the de-rate matching circuit 13 in this exemplary embodiment, if the de-rate matching is simply performed on the data stored in the frame memory 12, the sequence of the data to be stored in the TTI memory 16 becomes incorrect. In light of this, the de-rate matching circuit 13 according to the exemplary embodiment identifies the frame number of the processing frame and performs the de-rate matching of the received data in the sequence according to the subsequent first de-interleaving. Specifically, the de-rate matching circuit 13 determines whether the frame being processed is a frame to be processed by the first de-interleaver 14 based on the frame number of the frame being processed and the interleaving pattern cpat(x) indicating the sequence of the first de-interleaving (the steps S308, S404 and S420). Only when the frame being processed is determined as a frame to be processed by the first de-interleaver 14, the de-rate matching circuit 13 writes the data d read from the frame memory 12 into the TTI memory 16. Because the de-rate matching circuit 13 performs processing in this way, the first de-interleaver 14 to perform the first de-interleaving can be prepared without making any particular change to an existing circuit. Thus, the use of the de-rate matching circuit 13 according to the exemplary embodiment eliminates the need to redesign another circuit, thereby reducing a design period of the receiving circuit 100.

Second Exemplary Embodiment

Another example of the receiving-end data deletion processing in the de-rate matching according to the first exemplary embodiment is described hereinafter as a second exemplary embodiment of the present invention. In the following description, the same processing as in the first exemplary embodiment is denoted by the same reference symbols as in FIGS. 9A to 9C and not repeatedly described. In the second exemplary embodiment, a temporary storage register dtmp is used for the repetitive data integration (e.g. the step S410 in FIG. 9A), in addition to the basic operation described earlier, thereby reducing a processing time of the repetitive data integration. This reduces the number of times of memory reading and writing when repetitive data is repeated a plurality of times in one frame.

Figure 10A:
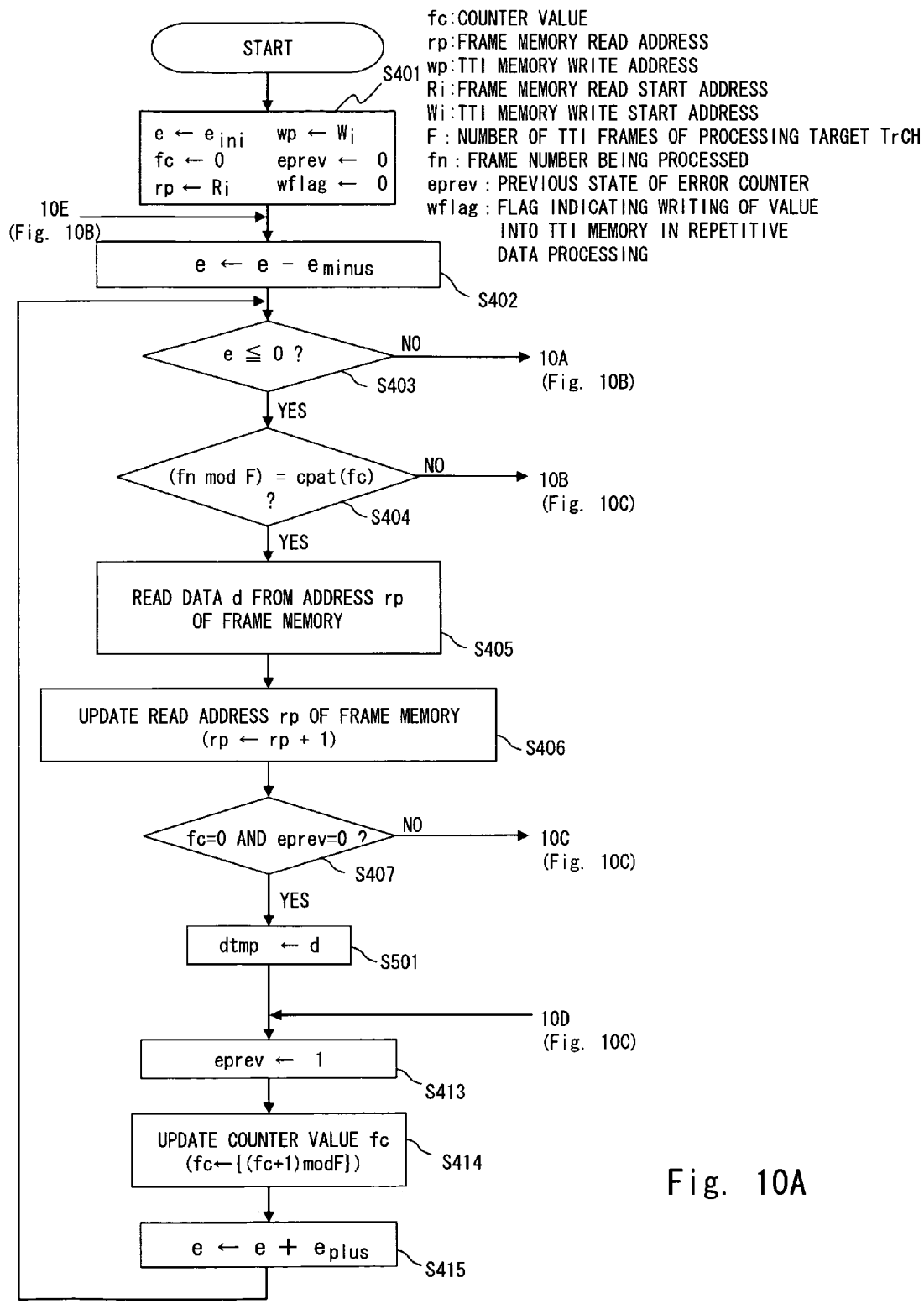
FIG. 10A is a flowchart showing receiving-end data deletion processing performed in a de-rate matching circuit according to a second exemplary embodiment of the present invention.
Figure 10B:
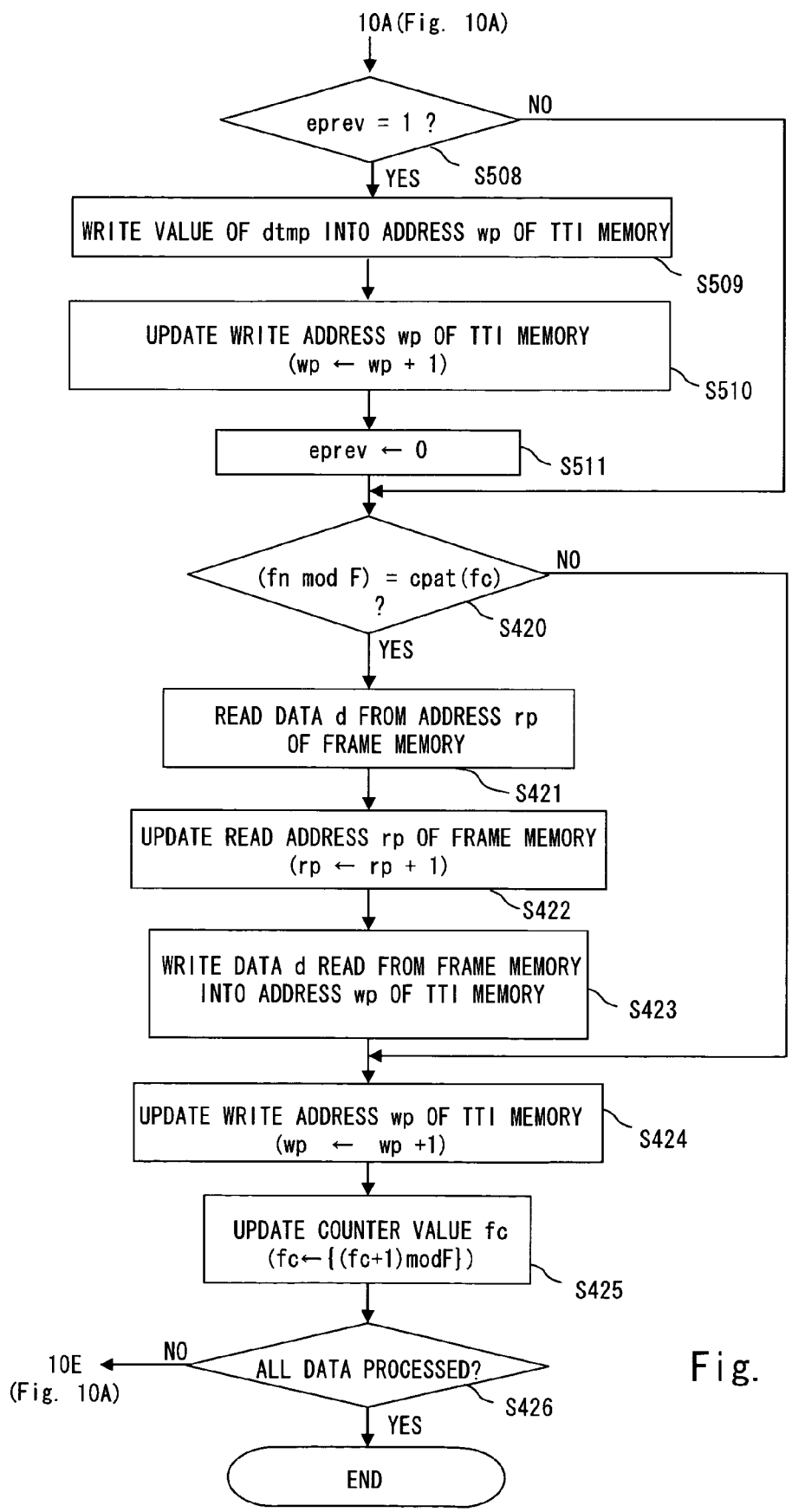
FIG. 10B is also a flowchart showing receiving-end data deletion processing performed in the de-rate matching circuit according to the second exemplary embodiment of the present invention.
Figure 10C:
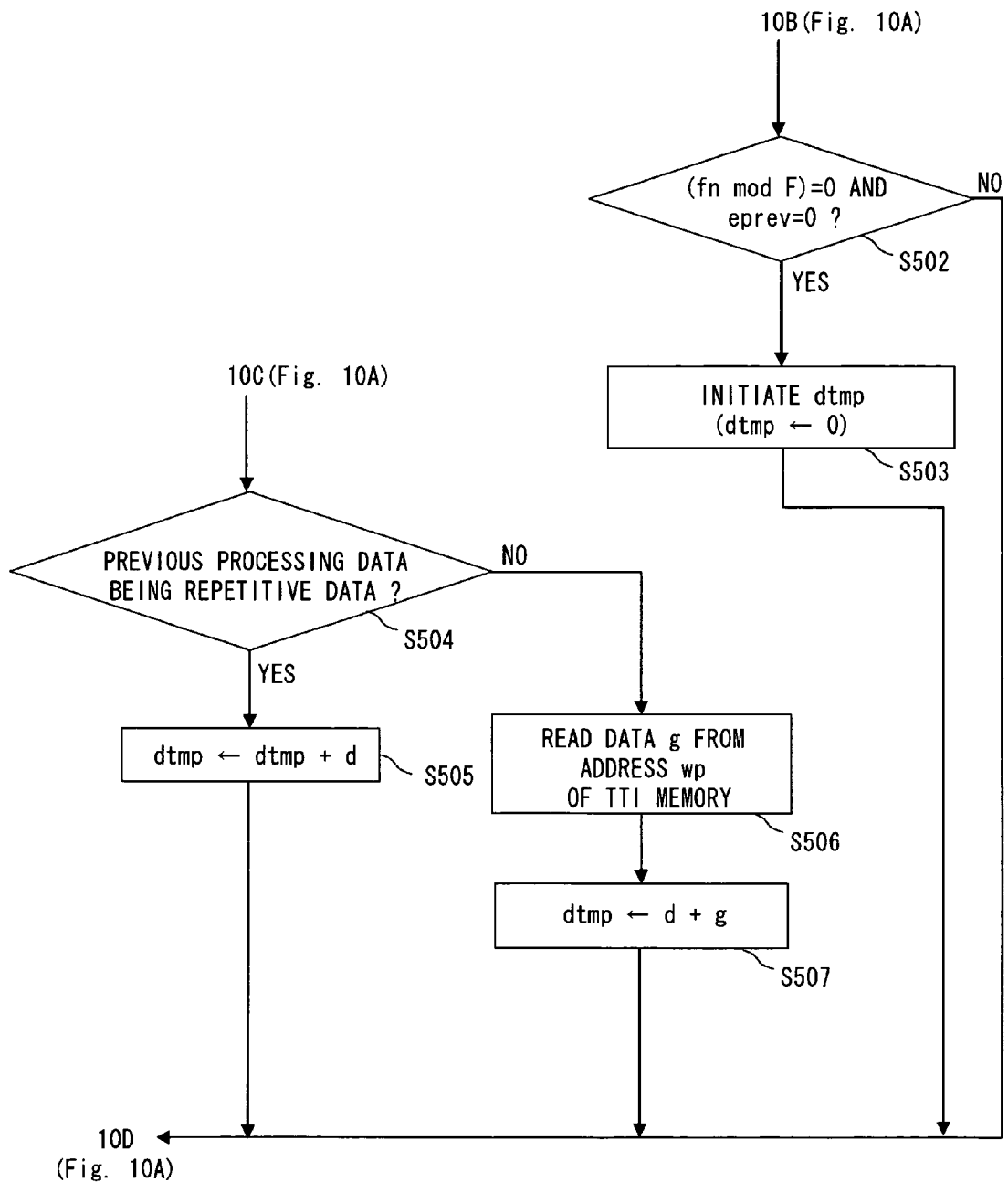
FIG. 10C is also a flowchart showing receiving-end data deletion processing performed in the de-rate matching circuit according to the second exemplary embodiment of the present invention.

FIGS. 10A to 10C are flowcharts showing the receiving-end data deletion processing according to the second exemplary embodiment of the present invention. Referring to FIGS. 10A to 10C, the processing of the steps S401 to S407 are performed firstly. Then, if the conditions of fc=0 and eprev=0 are satisfied in the step S407, the data d is stored into the temporary storage register dtmp (S501). Thus, the data d, which is written into the TTI memory 16 in the step S408 of the first exemplary embodiment, is stored into the temporary storage register dtmp in the step S501 of this exemplary embodiment.

On the other hand, if the conditions of fc=0 and eprev=0 are not satisfied in the step S407, it is determined whether the previous processing data is repetitive data (S504). If it is determined in the step S504 that the previous data is repetitive data (Yes in S504), the data d read from the frame memory 12 in the step S405 is added to the value stored in the temporary storage register dtmp, and the added result is stored into the temporary storage register dtmp (S505). If, on the other hand, it is determined in the step S504 that the previous data is not repetitive data (No in S504), the data g is read from the address wp of the TTI memory 16 (S506). Then, the data g is added to the data d read from the frame memory 12 in the step S405, and the added result is stored into the temporary storage register dtmp (S507).

Further, if it is determined in the step S404 that the frame being processed is not a frame to be processed (No in S404), it is determined whether the current frame is a head frame (((fn mod F)=0) and the eprev indicating the previous error counter status is 0 (S502). If the conditions are satisfied in the step S502 (Yes in S502), the temporary storage register dtmp is set to 0 to be initialized (S503). If, on the other hand, the conditions are not satisfied in the step S502 (No in S502), the process proceeds to the step S413. The process also proceeds to the step S413 when the steps S501, S503, S505 and S507 are completed. After performing the step S413, the process further performs the steps S414 and S415, and then returns to the step S403.

The processing described above is performed in the case where the variable e is equal to or smaller than 0 in the step S403. On the other hand, if the variable e is larger tan 0 in the step S403 (No in S403), the process proceeds to the step S508. In the step S508, it is determined whether the eprev indicating the previous error counter status is 1. If it is determined that the eprev is 1 indicating that the repetitive data processing is performed (Yes in S508), the value stored in the temporary storage register dtmp is written into the address wp of the TTI memory 16 (S509). Then, the write address wp of the TTI memory 16 is updated (e.g. wp←wp+1) (S510). After that, the eprev indicating the previous error counter status is updated to 0 (S511). Then, the process proceeds to the step S420. If it is determined in the step S508 that the eprev is not 1 (No in S508), the process also proceeds to the step S420.

The processing after the step S420 is the steps S421 to S426, and if it is determined in the step S426 that the above processing has been performed on all data contained in the frame being processed (Yes in S426), the process ends. If not (No in S426), the process repeats the processing from the step S402.

In the receiving-end data deletion processing according to the first exemplary embodiment, it is necessary to access the TTI memory 16 each cycle in the repetitive data integration of the steps S407 to S411. In the second exemplary embodiment, on the other hand, the de-rate matching circuit 13 includes the temporary storage register dtmp. The temporary storage register dtmp temporarily stores the value used for the repetitive data integration (the steps S406, S501, S504 to S507). Specifically, an integration result using the data d read from the frame memory 12 and the data g read from the TTI memory 16 is temporarily stored in the temporary storage register dtmp until the repetitive data integration ends. Further, the value stored in the temporary storage register dtmp is written into the TTI memory 16 after the repetitive data integration ends (S509). The de-rate matching circuit 13 according to the second exemplary embodiment thereby reduces the number of times to access the TTI memory 16 at the time of the repetitive data integration compared with the de-rate matching circuit 13 according to the first exemplary embodiment. In other words, it is possible to reduce the number of times to refer to the TTI memory 16 when inserting the repetitive data a plurality of times in one frame. Therefore, the process flow according to the second exemplary embodiment enables shortening of a processing time when inserting the repetitive data a plurality of times and reduction of the number of times of memory reading and writing.

Third Exemplary Embodiment

Figure 11:
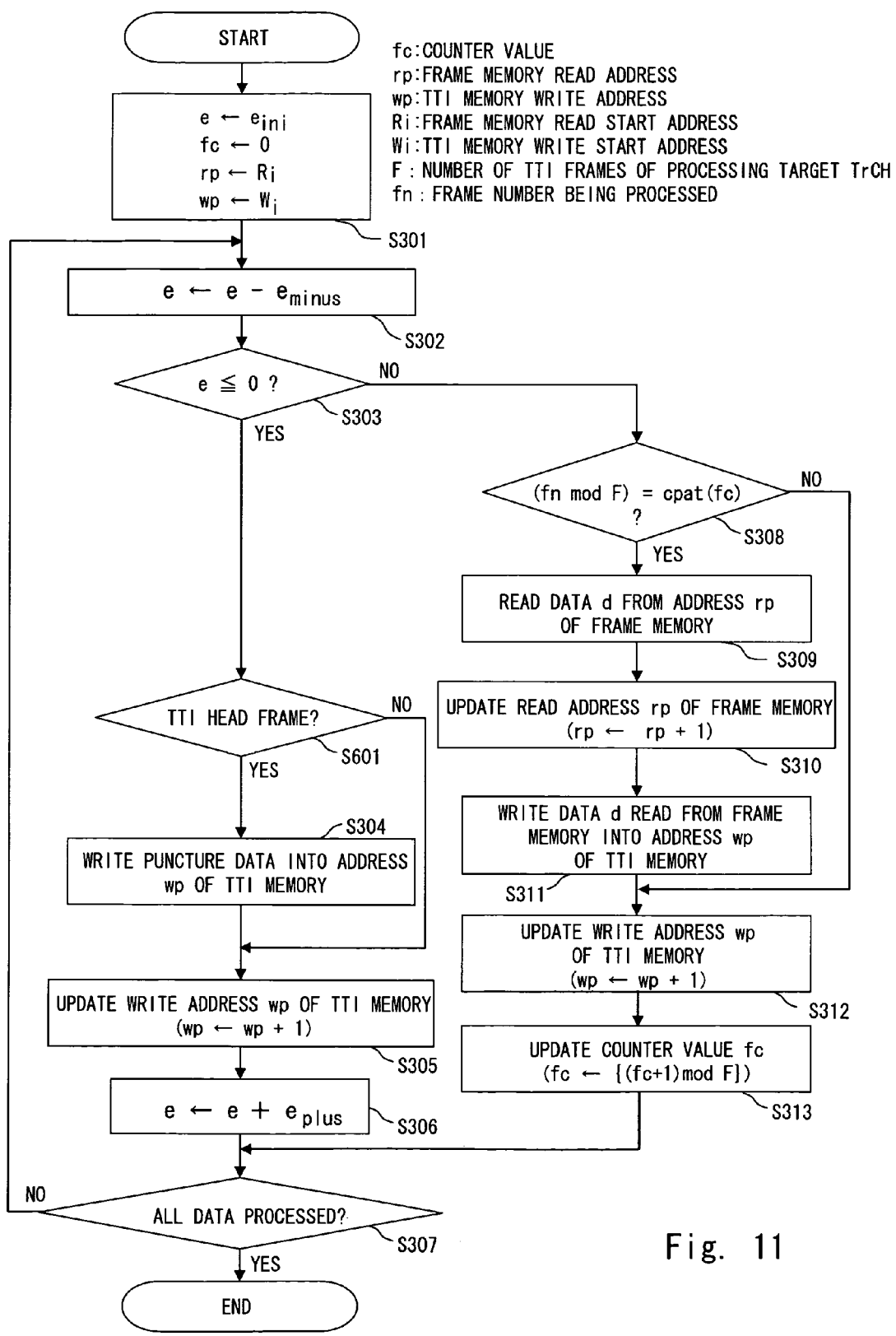
FIG. 11 is a flowchart showing receiving-end data insertion processing performed in a de-rate matching circuit according to a third exemplary embodiment of the present invention.

Another example of the receiving-end data insertion processing in the de-rate matching according to the first exemplary embodiment is described hereinafter as a third exemplary embodiment of the present invention. In the receiving-end data insertion processing according to the third exemplary embodiment, puncture data is written in the head frame only. FIG. 11 is a flowchart showing the process of such receiving-end data deletion processing. In the third exemplary embodiment also, the same processing as the processing shown in FIG. 8 is denoted by the same reference symbols as in FIG. 8 and not repeatedly described.

Referring to FIG. 11, in this exemplary embodiment, the step S601 is inserted to the process flow shown in FIG. 8. The step S601 is performed between the step S303 and the step S304. In the step S601, it is determined whether the frame being processed is the head frame of the TTI. Thus, it is determined whether the processing frame is the head frame before the puncture data writing in the step S304. If the frame being processed is the head frame (Yes in S601), the process proceeds to S304 and writes the puncture data into the address wp of the TTI memory 16. On the other hand, if the frame being processed is not the head frame (No in S601), the processing of the step S304 is not performed. Thus, the puncture data is not written into the TTI memory 16.

As described in the foregoing, in the receiving-end data insertion processing according to the third exemplary embodiment, the processing to insert the data corresponding to the eliminated data (puncture data insertion) is performed only on the head frame of the frame to be written into the TTI memory 16 in the de-rate matching when the data elimination has been performed at the transmitting end. This reduces the number of times to access the TTI memory 16. By performing the data elimination processing according to the third exemplary embodiment in the de-rate matching circuit 13, it is possible to reduce power consumption of the receiving circuit 100.

Fourth Exemplary Embodiment

Figure 12:
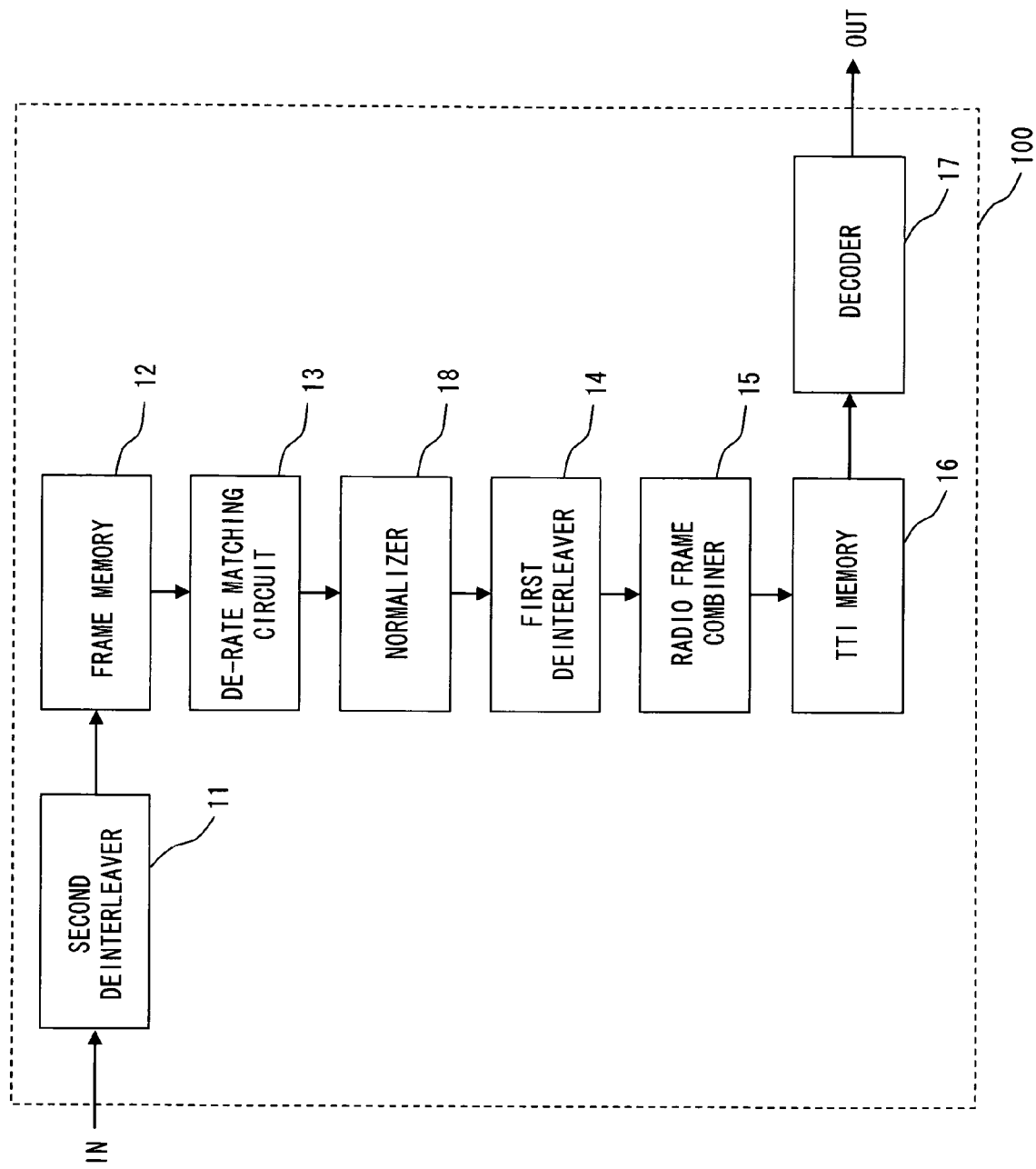
FIG. 12 is a block diagram of a receiving circuit according to a fourth exemplary embodiment of the present invention.

FIG. 12 shows a block diagram of the receiving circuit 100 according to a fourth exemplary embodiment of the present invention. Referring to FIG. 12, the receiving circuit 100 according to the fourth exemplary embodiment includes a normalizer 18 between the de-rate matching circuit 13 and the first de-interleaver 14. The normalizer 18 performs processing related to normalization that is performed in the de-rate matching. Thus, the normalizer 18 operates by transmitting and receiving data with the de-rate matching circuit 13. In the fourth exemplary embodiment also, the same blocks and the same processing as those in the first to third exemplary embodiments are denoted by the same reference symbols as in the first to third exemplary embodiments and not repeatedly described. According to the fourth exemplary embodiment, because the processing is performed on each frame, data before normalization or the value that is normalized within frame are stored in the frame memory 12. The transport channel may be made up of data of a plurality of frames, and, in such a case, it is necessary to perform normalization processing for equalizing the levels of data between frames in order to prevent the occurrence of performance degradation in the subsequent-stage processing.

The case where the normalization processing is added to the second and third exemplary embodiments is described hereinafter, although the normalization processing may be added to the basic structure of the first exemplary embodiment as well. The normalization processing according to the fourth exemplary embodiment is described hereinbelow.

In this exemplary embodiment, data format is defined as follows for explanation of the normalization processing:

data=$MNT*2^{-exp}$;

MNT: mantissa; and exp: exponent

In the above data format, the absolute value of data increases as the exponent value is smaller. The normalization according to the fourth exemplary embodiment equalizes the exponent value of each frame and controls the value of the mantissa portion MNT according thereto, thereby performing normalization between the frames. Specifically, the normalization is performed on the basis of the value with a small exponent value, which is the value with a large absolute value. An example of the normalization is described below.

If the data $d_1$ is represented by the expression (1) and the data $d_2$ is represented by the expression (2), the data $d_1'$ obtained by normalizing the data $d_1$ is represented by the expression (3). In the expressions (1) to (3), x is an exponent, and m is a mantissa.

$$d_1 = m_1 \times 2^{-x_1} \Lambda \qquad (1)$$

$$d_2 = m_1 \times 2^{-x_2} \Lambda \qquad (2)$$

$$d_1' = \begin{cases} m_1 & x_1 \leq x_2 \\ m_1 \times 2^{-(x_1-x_2)} & x_1 > x_2 \end{cases} \Lambda \qquad (3)$$

It is noted that, the above data are defined to explain the normalization by way of illustration, and this alternative example may be applied in the same manner to the normalization by other data representation methods.

Figure 13A:
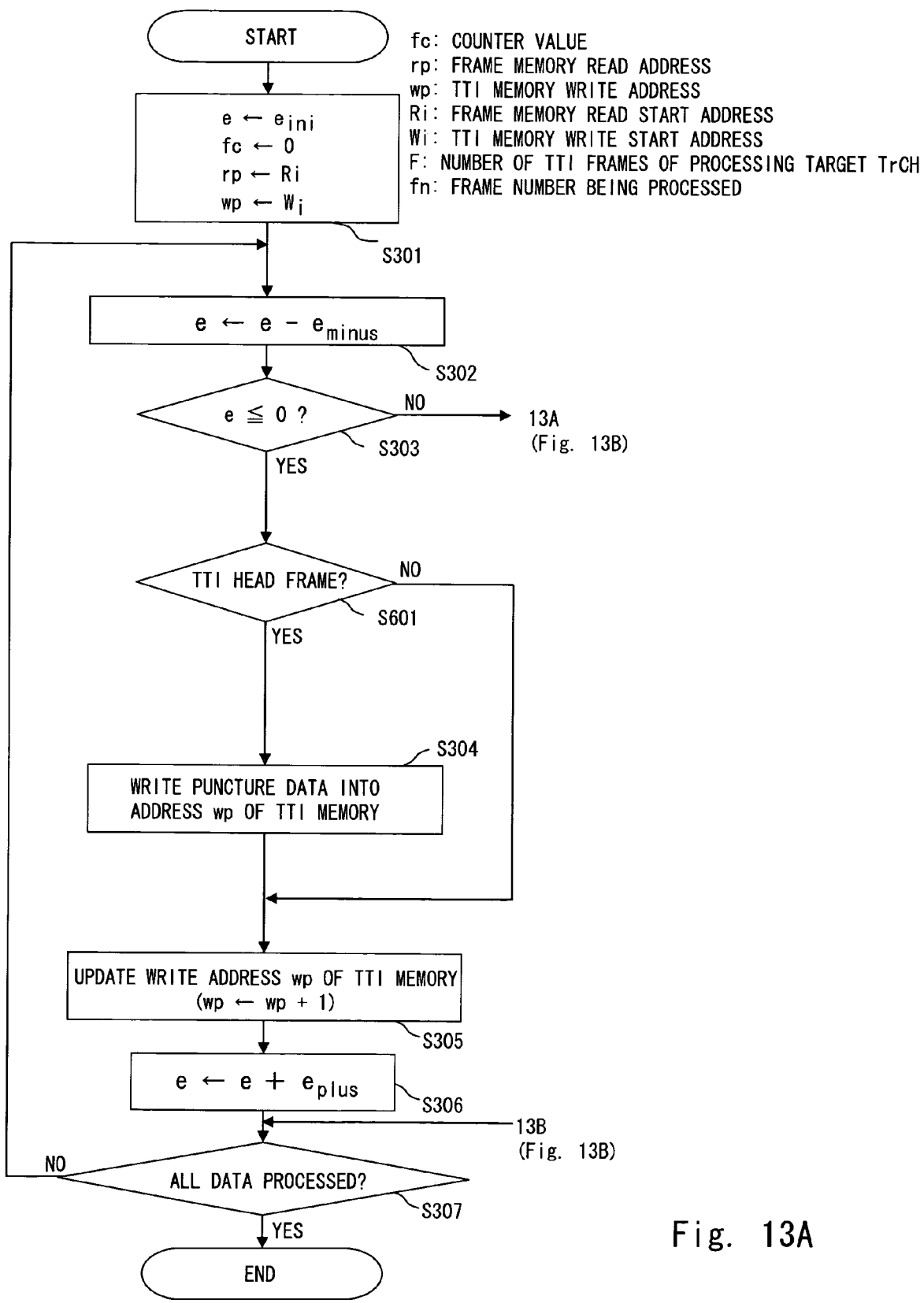
FIG. 13A is a flowchart showing receiving-end data insertion processing performed in a de-rate matching circuit according to the fourth exemplary embodiment of the present invention.
Figure 13B:
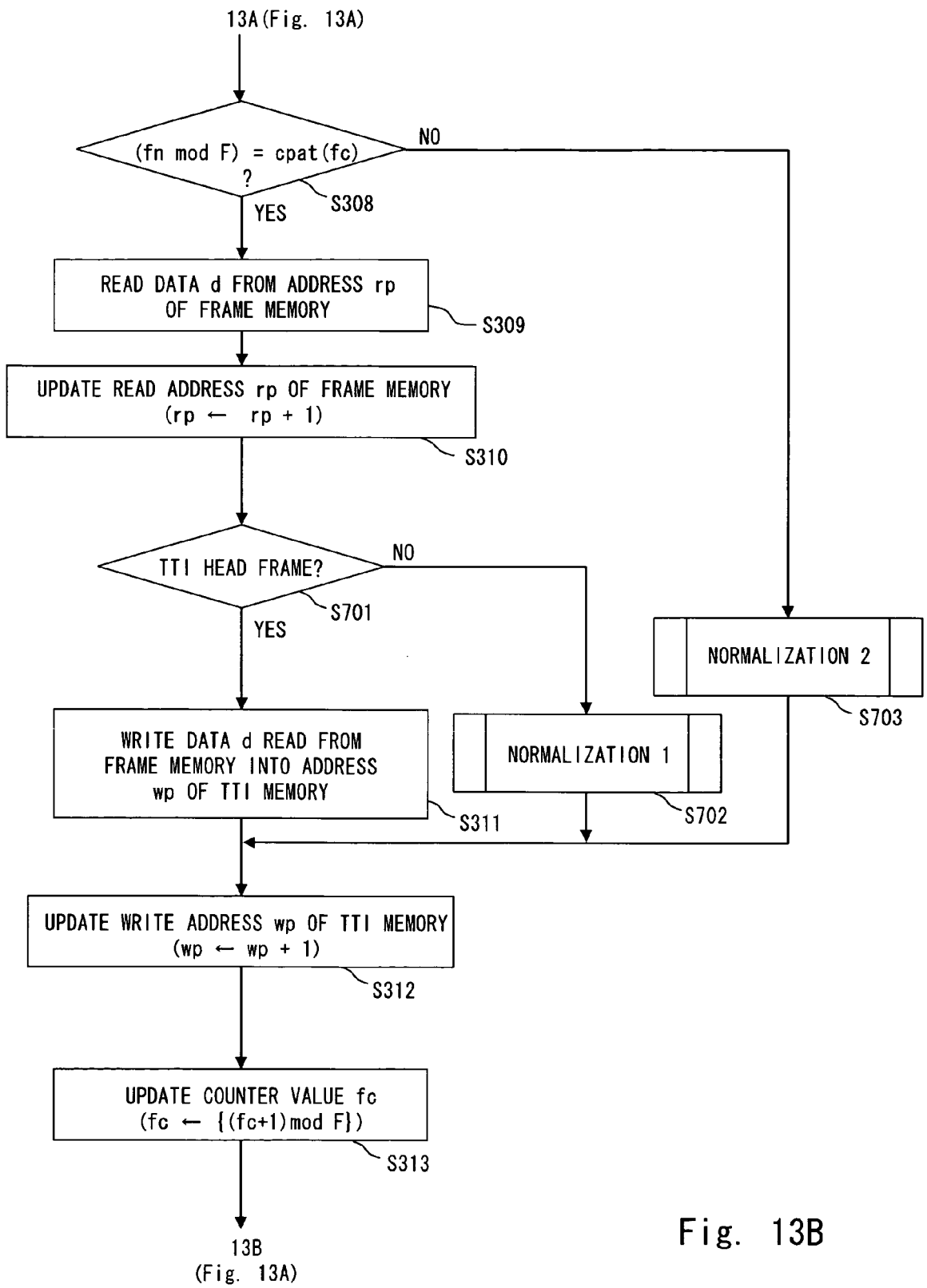
FIG. 13B is also a flowchart showing receiving-end data insertion processing performed in the de-rate matching circuit according to the fourth exemplary embodiment of the present invention.

FIGS. 13A and 13B are flowcharts showing the process of the normalization processing in the case of performing the receiving-end data insertion according to the fourth exemplary embodiment. Referring to FIGS. 13A and 13B, the processing related to the normalization is performed when the variable e is determined to be larger than 0 in the step S303 (No in S303). Further, the steps S701 to S703 are added as the processing related to the normalization. The step S701 is performed between the step S310 and the step S311. It is determined in the step S701 whether the frame being processed is the head frame of the TTI. The step S702 is a step to perform the first normalization processing (the normalization 1). The step S702 is performed when it is determined in the step S701 that the frame being processed is not the head frame of the TTI (No in S701). After the step S702, the process proceeds to the step S312. On the other hand, if it is determined in the step S701 that the frame being processed is the head frame of the TTI (Yes in S701), the processing of the step S311 is performed. The step S703 is performed when it is determined in the step S308 that the frame being processed is not a frame to be currently processed (No in S308). The step S703 is a step to perform the second normalization processing (the normalization 2). After the step S703, the process proceeds to the step S312.

Figure 14:
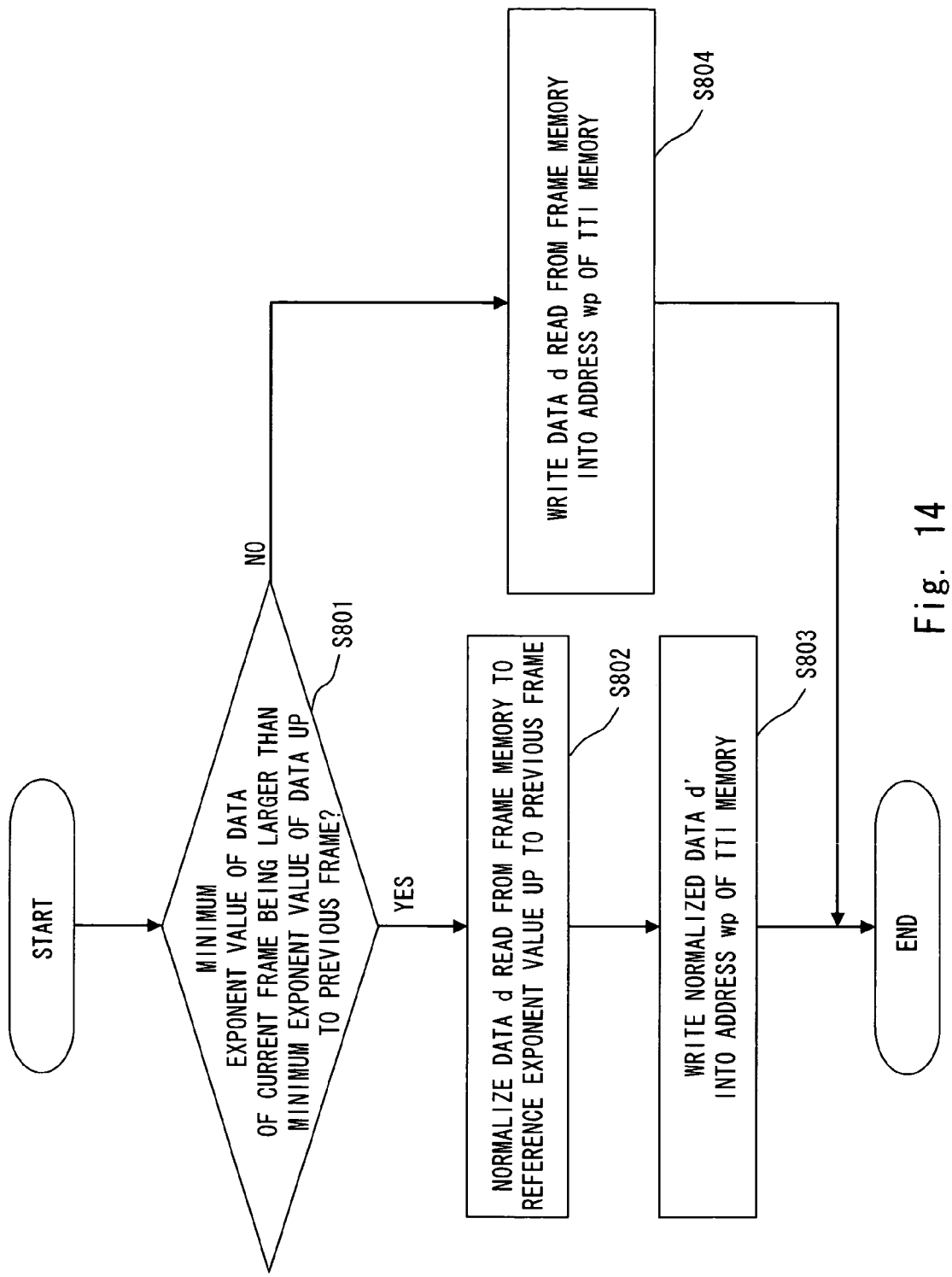
FIG. 14 is a flowchart showing processing of normalization 1 according to the fourth exemplary embodiment of the present invention.

The normalizations 1 and 2 are described hereinbelow. FIG. 14 is a flowchart showing the processing method of the normalization 1. Referring to FIG. 14, in the normalization 1, it is first determined whether the minimum exponent value of the data of the current frame is larger than the minimum exponent value of the data up to the previous frame (S801). If it is determined in the step S801 that the minimum exponent value of the data of the current frame is larger than the minimum exponent value of the data up to the previous frame (Yes in S801), the data read from the frame memory 12 is normalized to the reference exponent value up to the previous frame (S802). After the normalization, the normalized data is written into the address wp of the TTI memory 16 (S803). On the other hand, if it is determined in the step S801 that the minimum exponent value of the data of the current frame is equal to or smaller than the minimum exponent value of the data up to the previous frame (No in S801), the value read from the frame memory 12 is written into the address wp of the TTI memory 16 without making any change (S804).

Figure 15:
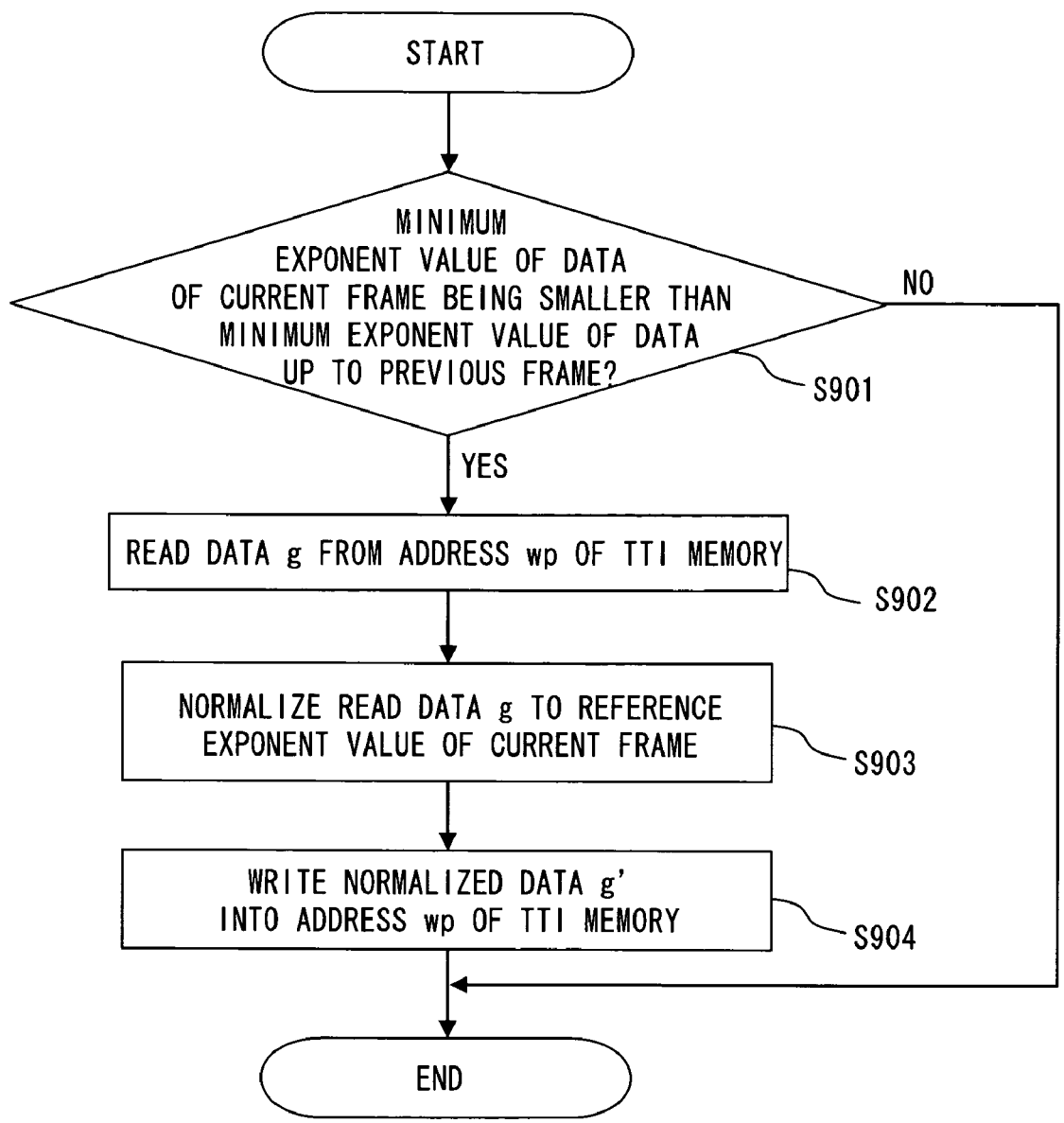
FIG. 15 is a flowchart showing processing of normalization 2 according to the fourth exemplary embodiment of the present invention.
Figure 16A:
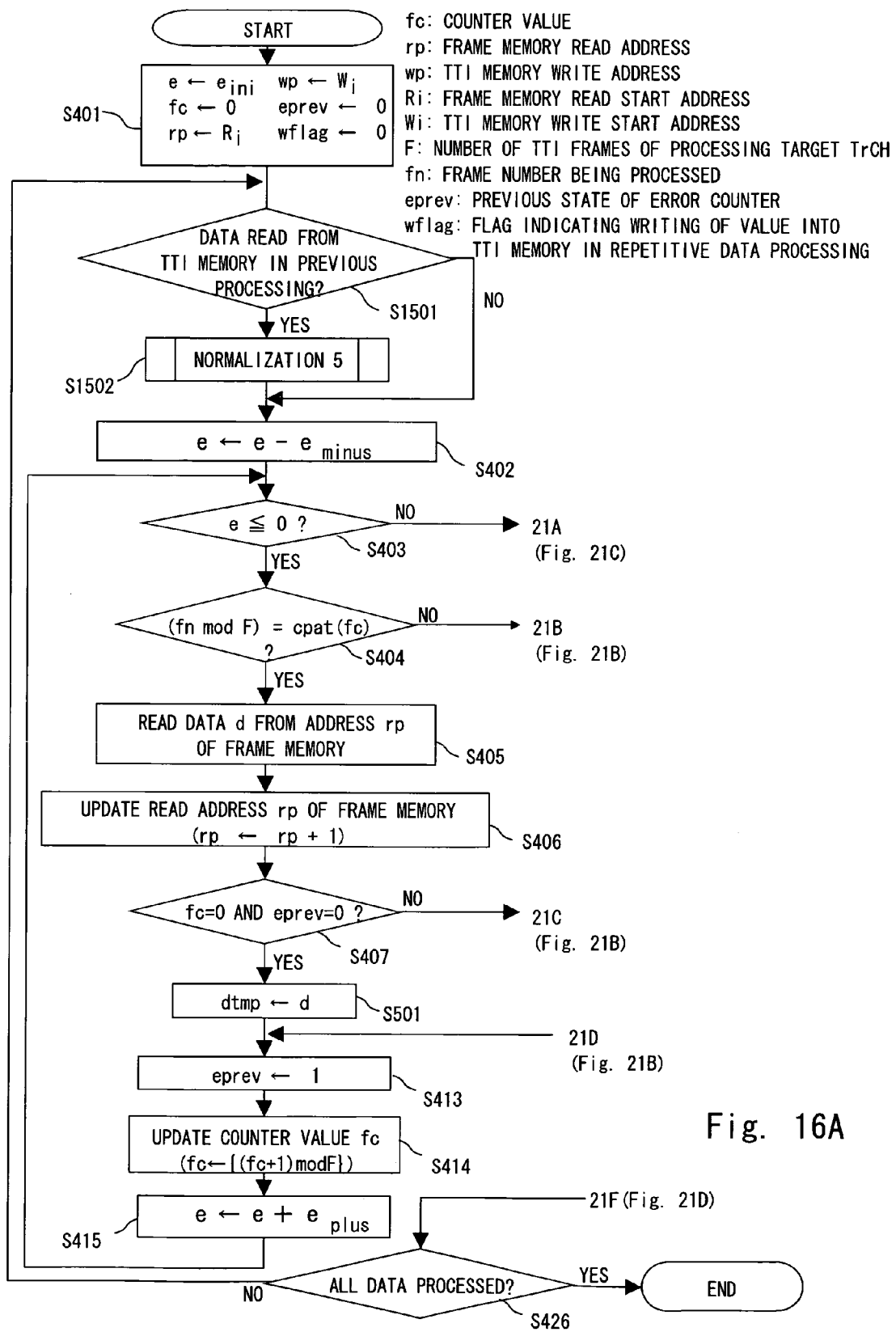
FIG. 16A is a flowchart showing receiving-end data deletion processing performed in the de-rate matching circuit according to the fourth exemplary embodiment of the present invention.
Figure 16B:
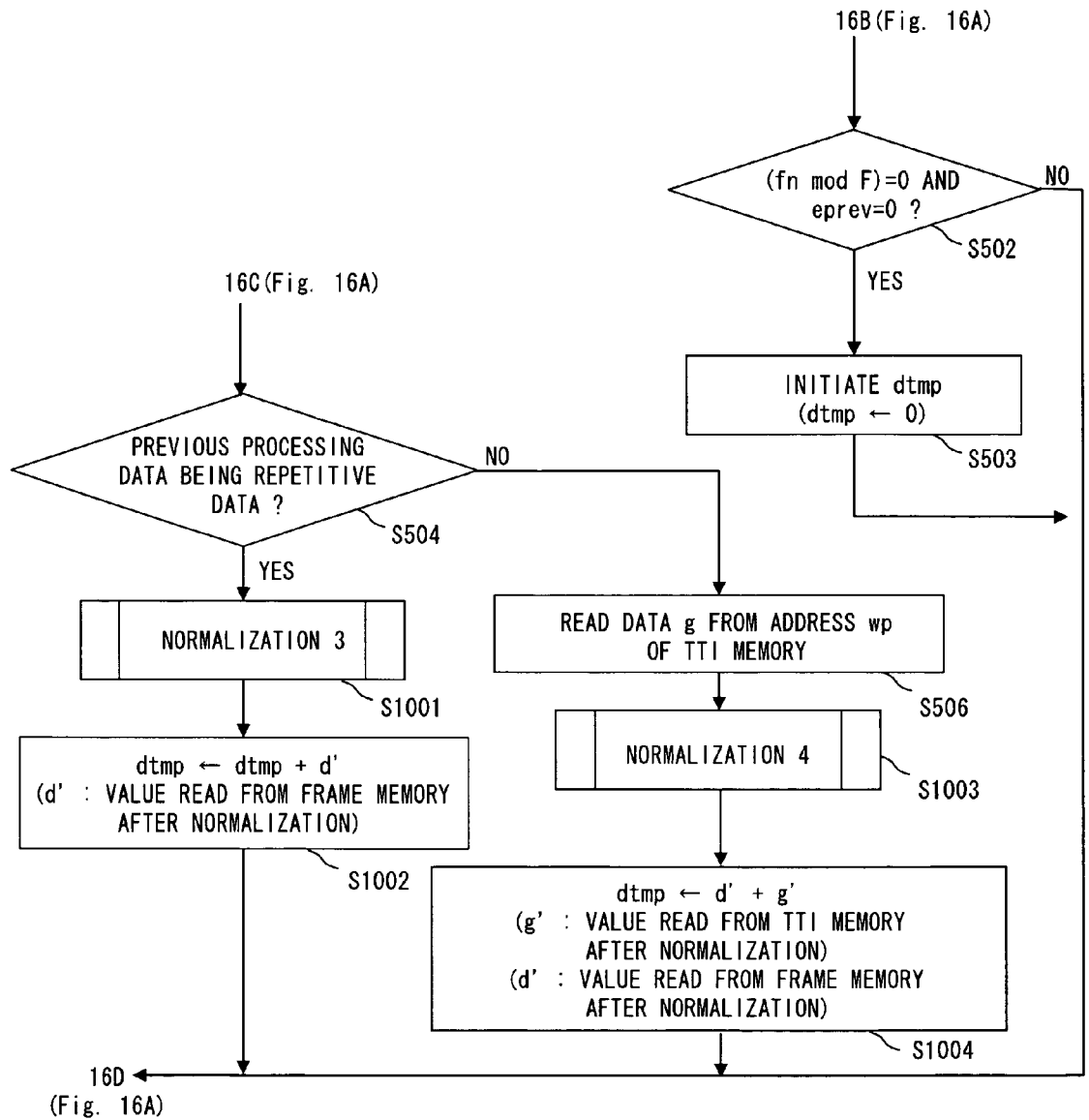
FIG. 16B is also a flowchart showing receiving-end data deletion processing performed in the de-rate matching circuit according to the fourth exemplary embodiment of the present invention.
Figure 16C:
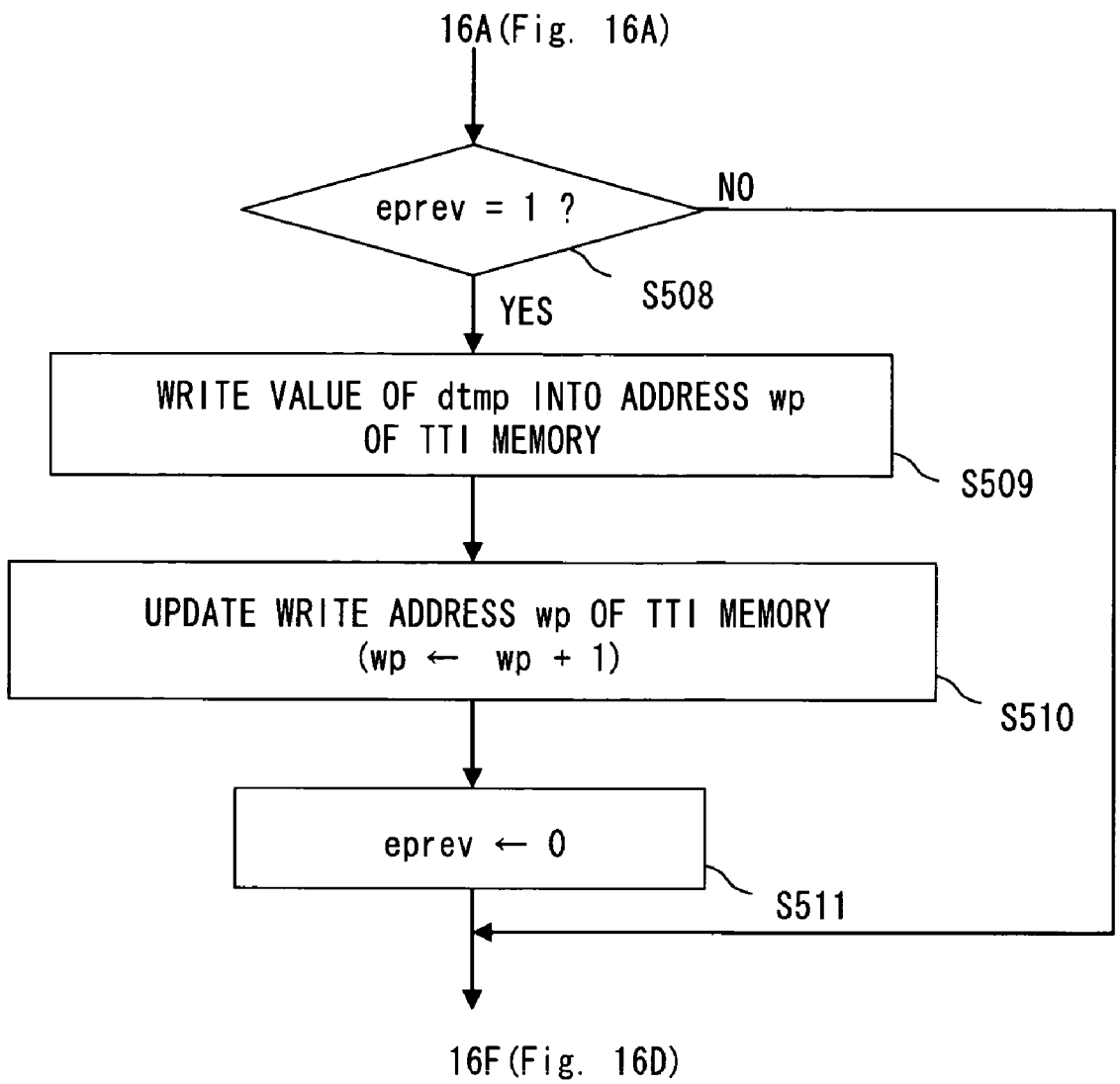
FIG. 16C is also a flowchart showing receiving-end data deletion processing performed in the de-rate matching circuit according to the fourth exemplary embodiment of the present invention.
Figure 16D:
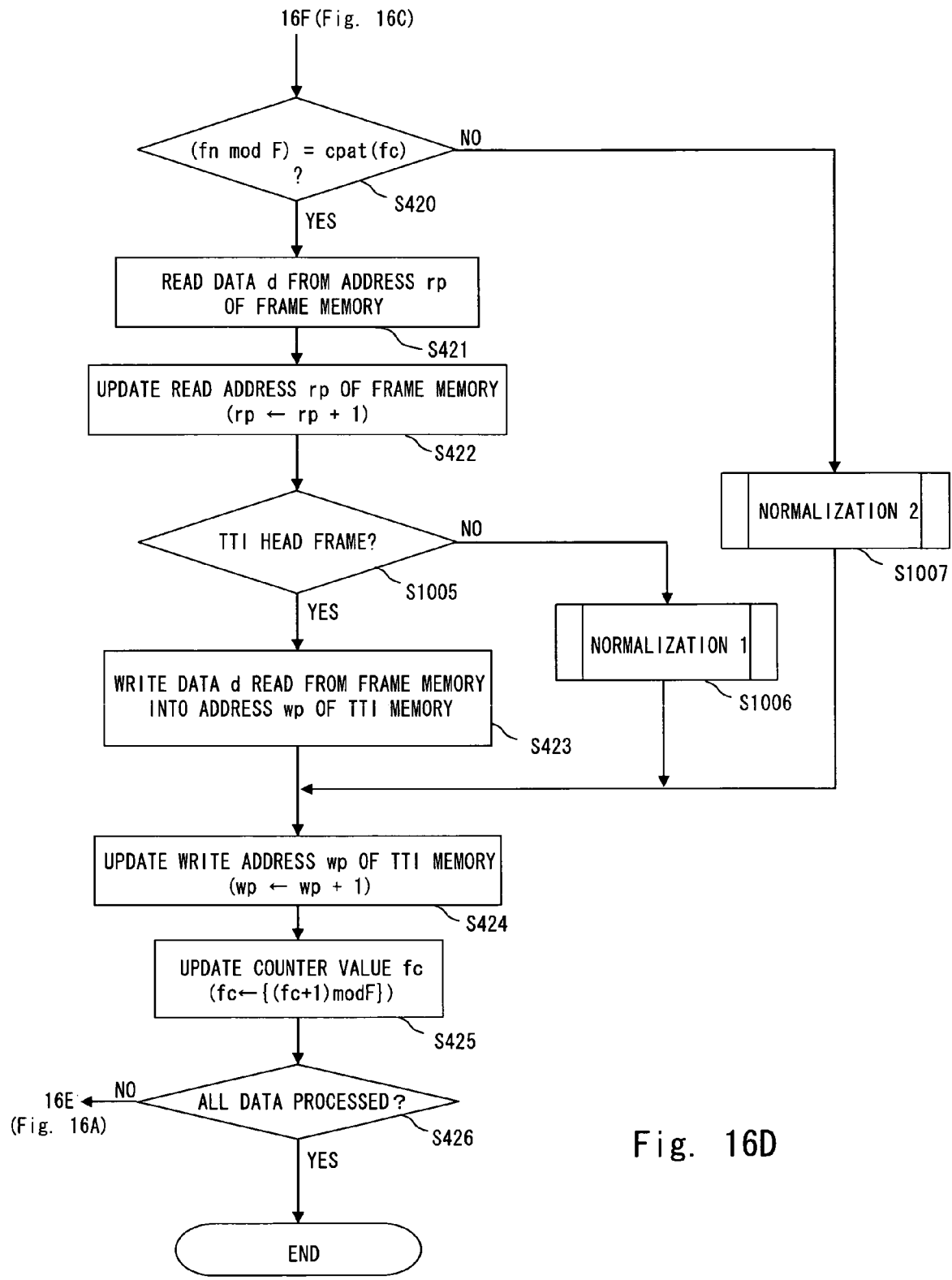
FIG. 16D is also a flowchart showing receiving-end data deletion processing performed in the de-rate matching circuit according to the fourth exemplary embodiment of the present invention.

FIG. 15 is a flowchart showing the processing method of the normalization 2. Referring to FIG. 15, in the normalization 2, it is first determined whether the minimum exponent value of the data of the current frame is smaller than the minimum exponent value of the data up to the previous frame (S901). If it is determined in the step S901 that the minimum exponent value of the data of the current frame is smaller than the minimum exponent value of the data up to the previous frame (Yes in S901), the data is read from the address wp of the TTI memory 16 (S902). Then, the read data is normalized to the reference exponent value of the current frame (S903). After that, the normalized data is written into the address wp of the TTI memory 16 (S904). On the other hand, if it is determined in the step S901 that the minimum exponent value of the data of the current frame is equal to or larger than the minimum exponent value of the data up to the previous frame (No in S901), the process ends.

Next, the normalization processing in the receiving-end data deletion is described hereinafter. FIGS. 16A to 16D are the flowcharts showing the processing method in the case of performing the receiving-end data deletion according to the fourth exemplary embodiment. The processing added for the normalization processing in FIGS. 16A to 16D are the steps S1001 to S1004 shown in FIG. 16B and the steps S1005 to S1007 shown in FIG. 16D.

The step S1001 is the third normalization processing (the normalization 3) that is performed when it is determined in the step S504 that the previous processing data is repetitive data (Yes in S504). The detail of the normalization 3 is described later. After the normalization 3 is performed in the step S1001, the processing of the step S1002 is performed. In the step S1002, the data d' read from the frame memory 12 after the normalization is stored into the temporary storage register dtmp. After the processing of the step S1002 is performed, the process proceeds to the step S413. On the other hand, if it is determined in the step S504 that the previous processing data is not repetitive data (No in S504), the fourth normalization processing (the normalization 4) is performed (S1003). The detail of the normalization 4 is described later. The normalization 4 is performed after reading the data g from the TTI memory 16 in the step S506. After the normalization 4 is performed, the data g' read from the TTI memory 16 after the normalization and the data d' read from the frame memory 12 after the normalization are added together, and a result is stored into the temporary storage register dtmp (S1004). After the step S1004, the process proceeds to the step S413. As in the processing of the steps S1002 and S1004, the normalized data is used for the repetitive data integration as well in the fourth exemplary embodiment.

The step S1005 is performed between the step S422 and the step S423. It is determined in the step S1005 whether the frame being processed is the head frame of the TTI. The step S1006 is a step to perform the normalization 1, and the processing shown in FIG. 14 is performed. The step S1006 is performed when it is determined in the step S1005 that the frame being processed is not the head frame of the TTI (No in S1005). After the step S1006, the process proceeds to the step S424. The step S1007 is performed when it is determined in the step S420 that the frame being processed is not a frame to be currently processed (No in S420). The step S1007 is a step to perform the normalization 2, and the processing shown in FIG. 15 is performed. After the step S1007, the process proceeds to the step S424. The normalization 1 performed in the step S1006 and the normalization 2 performed in the step S1007 are normalization processing performed on the data that is not repetitive data.

Figure 17:
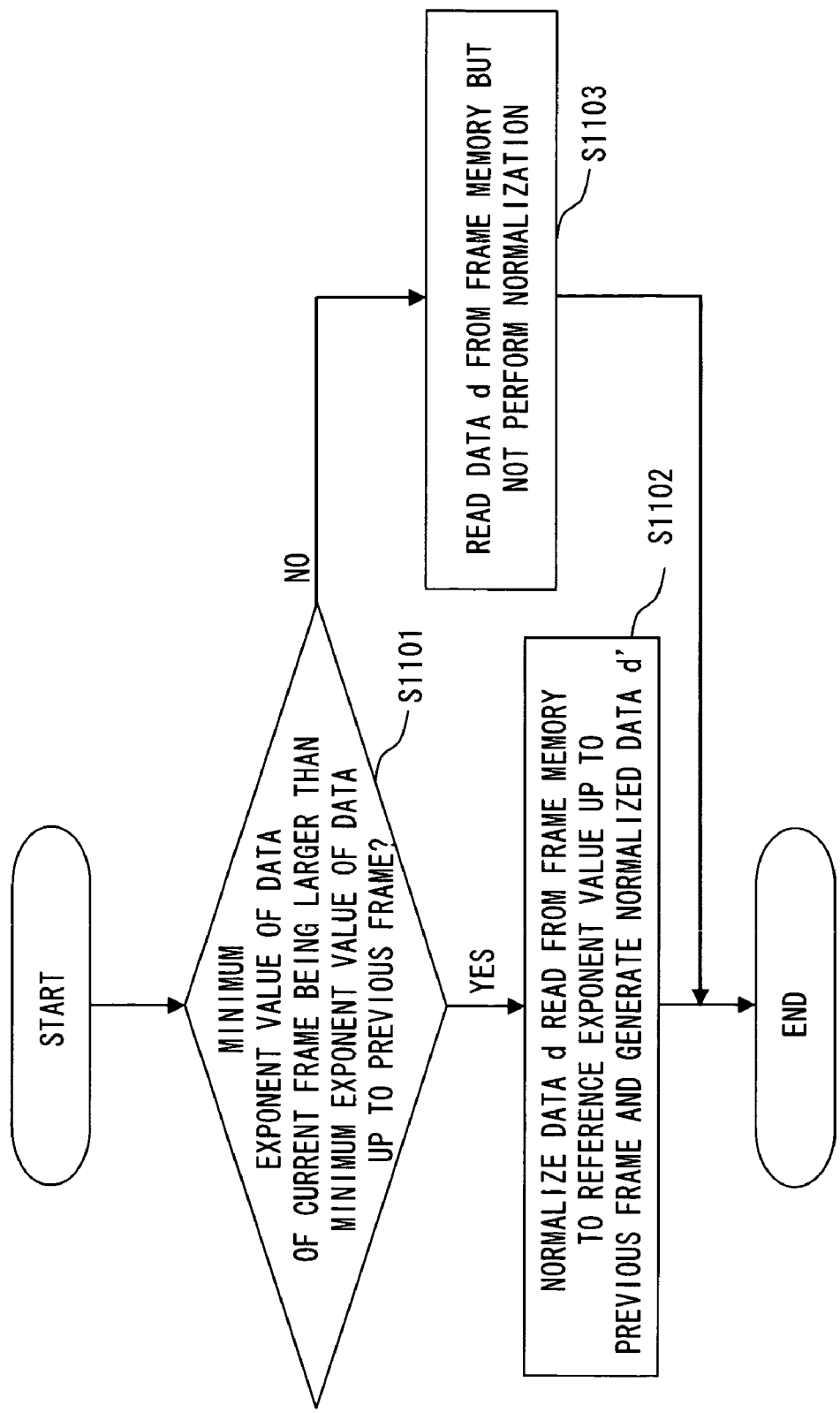
FIG. 17 is a flowchart showing processing of normalization 3 according to the fourth exemplary embodiment of the present invention.

The process of the normalization 3 is described hereinafter. FIG. 17 is a flowchart showing the process of the normalization 3. Referring to FIG. 17, in the normalization 3, it is first determined whether the minimum exponent value of the data of the current frame is larger than the minimum exponent value of the data up to the previous frame (S1101). If it is determined in the step S1101 that the minimum exponent value of the data of the current frame is larger than the minimum exponent value of the data up to the previous frame (Yes in S1101), the data d read from the frame memory 12 is normalized to the reference exponent value up to the previous frame to generate the normalized data d' (S1102). The normalized data d' is treated as the data d in the subsequent processing. On the other hand, if it is determined in the step S1101 that the minimum exponent value of the data of the current frame is equal to or smaller than the minimum exponent value of the data up to the previous frame (No in S1101), the normalization on the data d read from the frame memory 12 is not performed (S1103).

Figure 18:
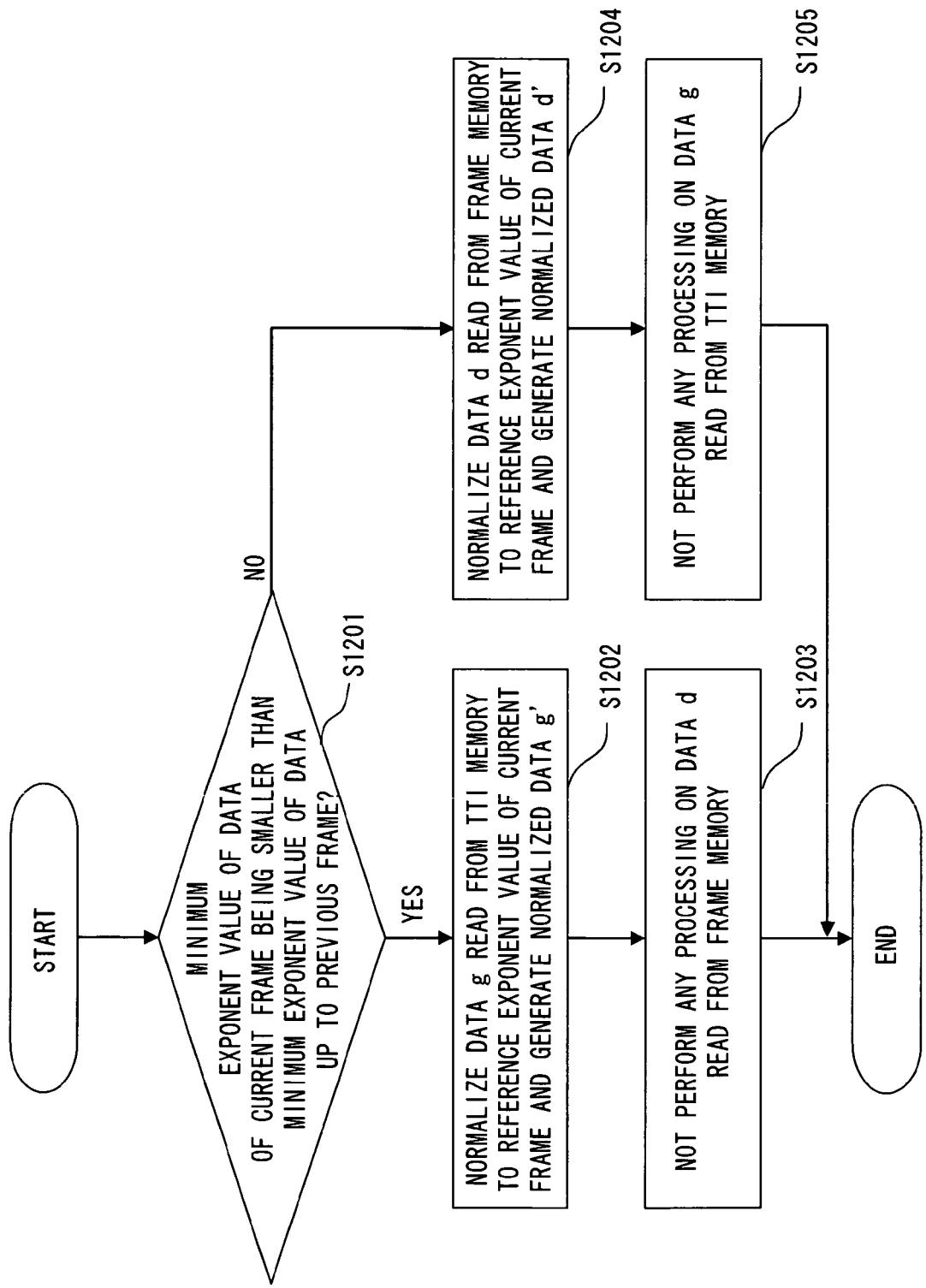
FIG. 18 is a flowchart showing processing of normalization 4 according to the fourth exemplary embodiment of the present invention.

FIG. 18 is a flowchart showing the process of the normalization 4. Referring to FIG. 18, in the normalization 4, it is first determined whether the minimum exponent value of the data of the current frame is smaller than the minimum exponent value of the data up to the previous frame (S1201). If it is determined in the step S1201 that the minimum exponent value of the data of the current frame is smaller than the minimum exponent value of the data up to the previous frame (Yes in S1201), the data g read from the TTI memory 16 is normalized to the reference exponent value of the current frame to generate the normalized data g' (S1202). At this time, no processing is performed on the data d read from the frame memory 12 (S1203). On the other hand, if it is determined in the step S1201 that the minimum exponent value of the data of the current frame is equal to or larger than the minimum exponent value of the data up to the previous frame (No in S1201), the data d read from the frame memory 12 is normalized to the reference exponent value of the current frame to generate the normalized data d' (S1204). At this time, no processing is performed on the data g read from the TTI memory 16 (S1205).

As described in the foregoing, according to the fourth exemplary embodiment, the normalizer 18 performs the normalization processing in the case of performing the de-rate matching in units of frames by referring to the minimum exponent value of the previous frame in the steps S801, S901, S1101 and S1201. Further, the de-rate matching circuit 13 and the normalizer 18 in the fourth exemplary embodiment perform the normalization on each of the data used for the de-rate matching. By performing such processing, it is possible to perform the normalization to equalize the levels of the data between frames. The execution of the normalization processing prevents performance degradation in the processing of the circuit connected to the subsequent stage of the de-rate matching circuit 13.

Fifth Exemplary Embodiment

The configuration in which the TTI memory 16 is composed of a plurality of memories or a plurality of banks is described hereinafter as a fifth exemplary embodiment of the present invention. With the TTI memory 16 having such a configuration, it is possible to write or read two data simultaneously, for example. The de-rate matching according to the fifth exemplary embodiment is described hereinafter about the case where the TTI memory 16 is composed of a plurality of banks. In the fifth exemplary embodiment, the de-rate matching in the fourth exemplary embodiment is performed on the TTI memory 16 that includes a plurality of banks. Thus, the process flow of the the de-rate matching in the fifth exemplary embodiment is different from that in the fourth exemplary embodiment according to the configuration of the TTI memory 16. In the following description, the flow using the same process as the process in the first to fourth exemplary embodiments is denoted by the same reference symbols and not repeatedly described.

Figure 19A:
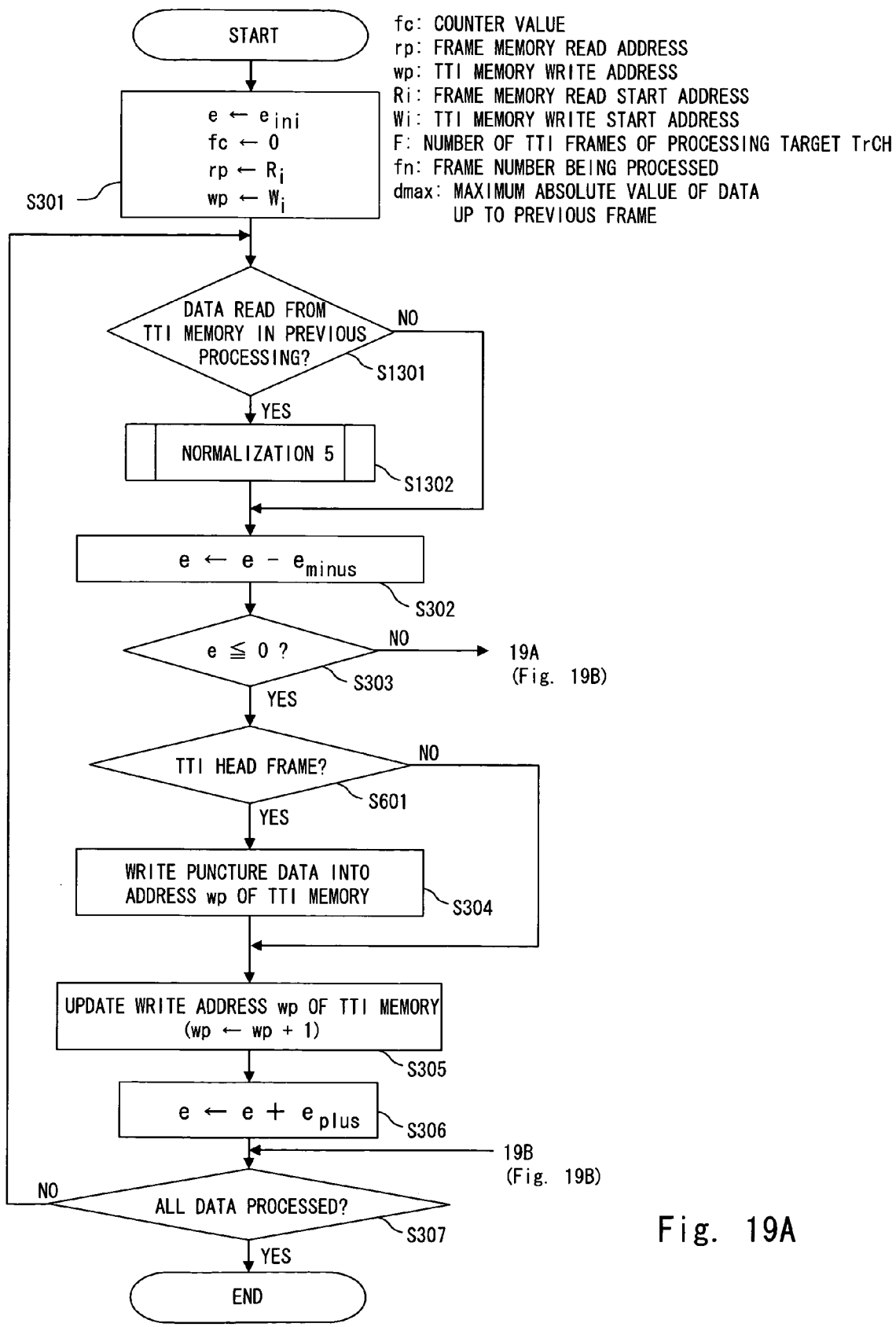
FIG. 19A is a flowchart showing receiving-end data insertion processing performed in a de-rate matching circuit according to a fifth exemplary embodiment of the present invention.
Figure 19B:
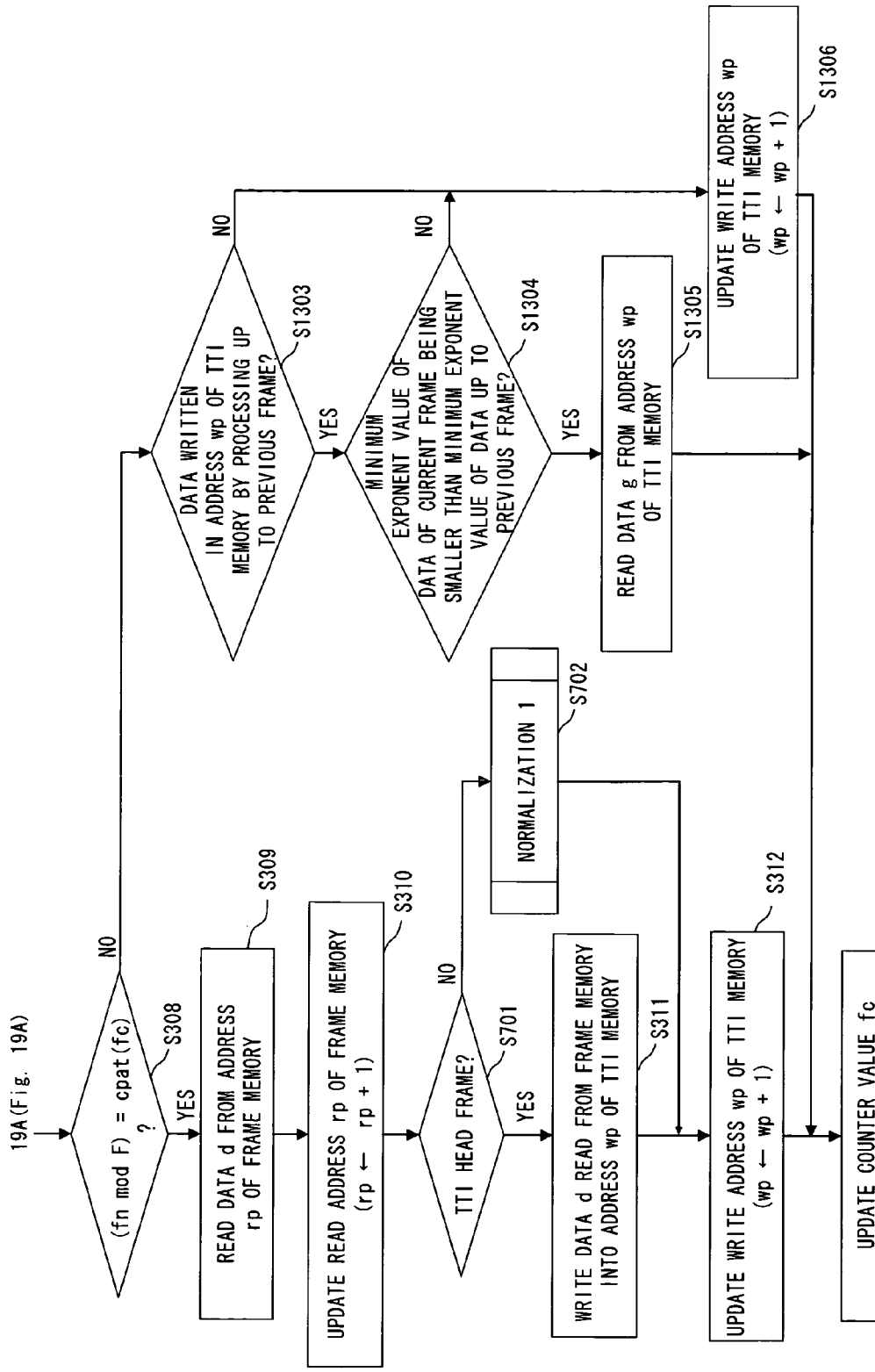
FIG. 19B is a flowchart showing receiving-end data insertion processing performed in the de-rate matching circuit according to the fifth exemplary embodiment of the present invention.

FIGS. 19A and 19B are flowcharts showing the method of the receiving-end data insertion according to the fifth exemplary embodiment of the present invention. Referring to FIGS. 19A and 19B, the steps S1301 to S1306, which are different from the exemplary embodiments described earlier, are performed in the fifth exemplary embodiment.

The step S1301 is performed after the initialization of the parameters is completed (S301). In the step S1301, it is determined whether data is read from the TTI memory 16 in the previous processing. If it is determined in the step S1301 that the data is read from the TTI memory 16 in the previous processing (Yes in S1301), the fifth normalization processing (the normalization 5) is performed (S1302). After the normalization 5 ends, the variable e is decremented by $e_{minus}$ in the step S302. The normalization 5 normalizes the data stored in the TTI memory 16 according to the size of the data of the previously processed frame and the data of the current frame. The detail of the normalization 5 is described later. On the other hand, if it is determined in the step S1301 that the data is not read from the TTI memory 16 in the previous processing (No in S1301), the process proceeds to the step S302 without performing the normalization 5.

The step S1303 is performed when it is determined in the step S308 that the frame being processed is not a frame to be currently processed (No in S308). In the step S1303, it is determined whether the processing data up to the previous frame is written to the address wp of the TTI memory 16. If it is determined in the step S1303 that the processing data up to the previous frame is written to the address wp of the TTI memory 16 (Yes in S1303), the step S1304 is performed. In the step S1304, it is determined whether the minimum exponent value of the data of the current frame is smaller than the minimum exponent value of the data up to the previous frame. If it is determined in the step S1304 that the minimum exponent value of the data of the current frame is smaller than the minimum exponent value of the data up to the previous frame (Yes in S1304), the process proceeds to the step S1305. In the step S1305, the data g is read from the address wp of the TTI memory 16. After the step S1305, the process proceeds to the step S313. On the other hand, if it is determined in the step S1303 that the processing data up to the previous frame is not written into the address wp of the TTI memory 16 (No in S1303), and if it is determined in the step S1304 that the minimum exponent value of the data of the current frame is equal to or larger than the minimum exponent value of the data up to the previous frame (No in S1304), the process executes the step S1306. In the step S1306, the write address wp of the TTI memory 16 is updated (e.g. wp←wp+1). After the step S1306, the process proceeds to the step S313.

Figure 20:
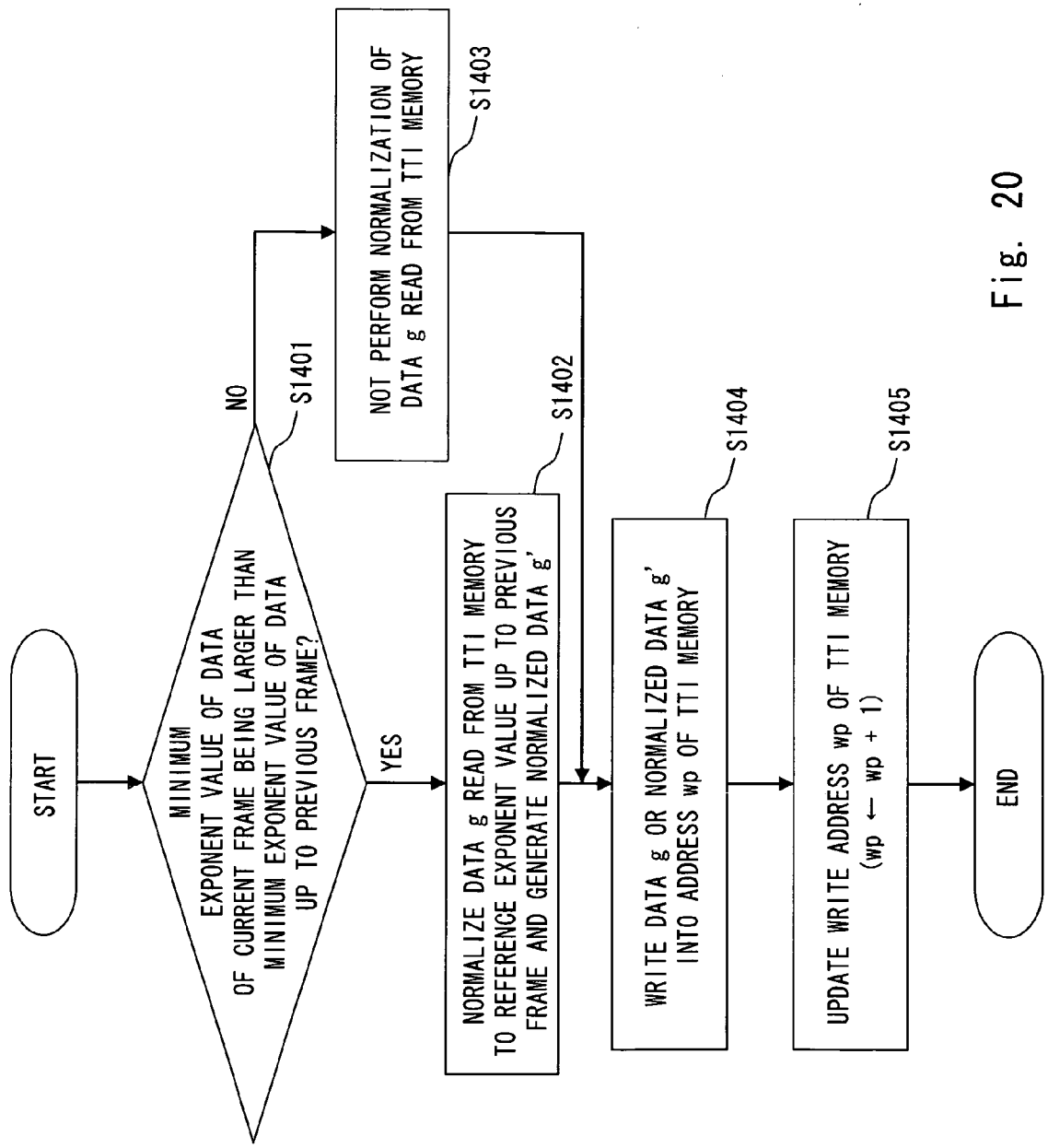
FIG. 20 is a flowchart showing processing of normalization 5 according to the fifth exemplary embodiment of the present invention.

FIG. 20 is a flowchart showing the process of the normalization 5. Referring to FIG. 20, in the normalization 5, it is first determined whether the minimum exponent value of the data of the current frame is larger than the minimum exponent value of the data up to the previous frame (S1401). If it is determined in the step S1401 that the minimum exponent value of the data of the current frame is larger than the minimum exponent value of the data up to the previous frame (Yes in S1401), the process proceeds to the step S1402. In the step S1402, the data g read from the TTI memory 16 is normalized to the reference exponent value up to the previous frame to generate the normalized data g'. Then, the normalized data g' is written into the address wp of the TTI memory 16 (S1404). On the other hand, if it is determined in the step S1401 that the minimum exponent value of the data of the current frame is equal to or smaller than the minimum exponent value of the data up to the previous frame (No in S1401), the process proceeds to the step S1404 without performing the processing of the step S1402. If the step S1404 is executed after the step S1403, the date to be written into the TTI memory 16 is the data g that is not normalized. Then, the write address wp of the TTI memory 16 is updated (e.g. wp←wp+1) (1405).

As described above, in the receiving-end data insertion processing according to the fifth exemplary embodiment, the normalization is performed on the data stored in the TTI memory 16 according to the size of the data of the previously processed frame and the data of the current frame before performing processing on the frame data (S1301, S1302). The address on the TTI memory 16 to be accessed differs between the normalization on the data of the current frame performed in the normalization 1 and the normalization on the data in the TTI memory 16 performed in the normalization 5. It is thereby possible to simultaneously access the TTI memory 16 in the normalization 1 and the normalization 5 according to the fifth exemplary embodiment. Further, the receiving-end data deletion according to the fifth exemplary embodiment includes the steps S1303 to S1306 in place of the normalization 2 according to the fourth exemplary embodiment. Among those steps, the data g read from the TTI memory 16 in the step S1305 is written back to the TTI memory 16 by the normalization 5. Thus, the data g read in the step S1305 can be also written back to the TTI memory 16 at the same time as accessing the TTI memory 16 by in the normalization 1. Because the receiving-end data insertion processing according to the fifth exemplary embodiment performs an access to the TTI memory 16 made in the normalization 1 and the normalization 5 simultaneously in one cycle, it is possible to increase the speed of the rate matching and the normalization.

Figure 21A:
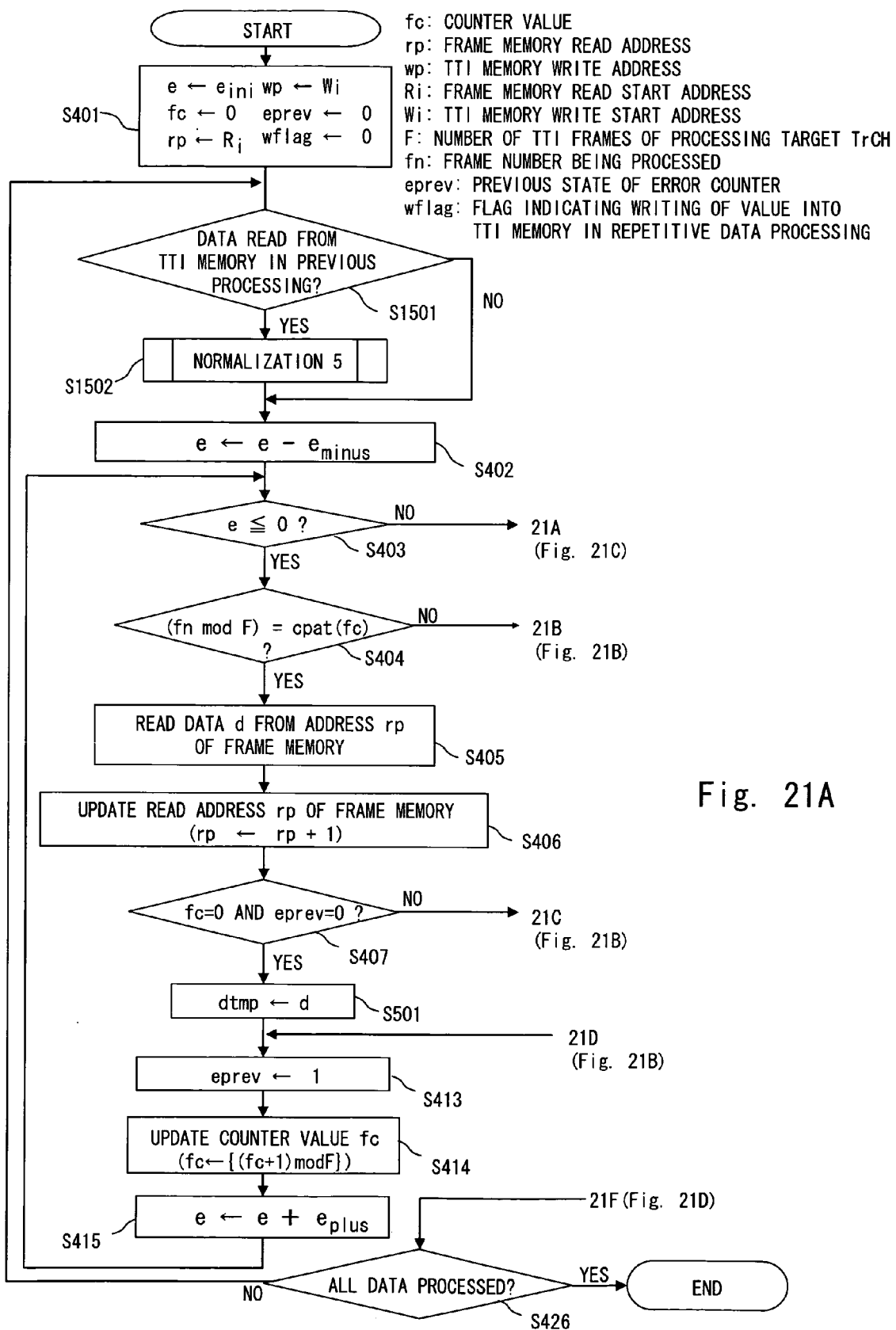
FIG. 21A is a flowchart showing receiving-end data deletion processing performed in the de-rate matching circuit according to the fifth exemplary embodiment of the present invention.
Figure 21B:
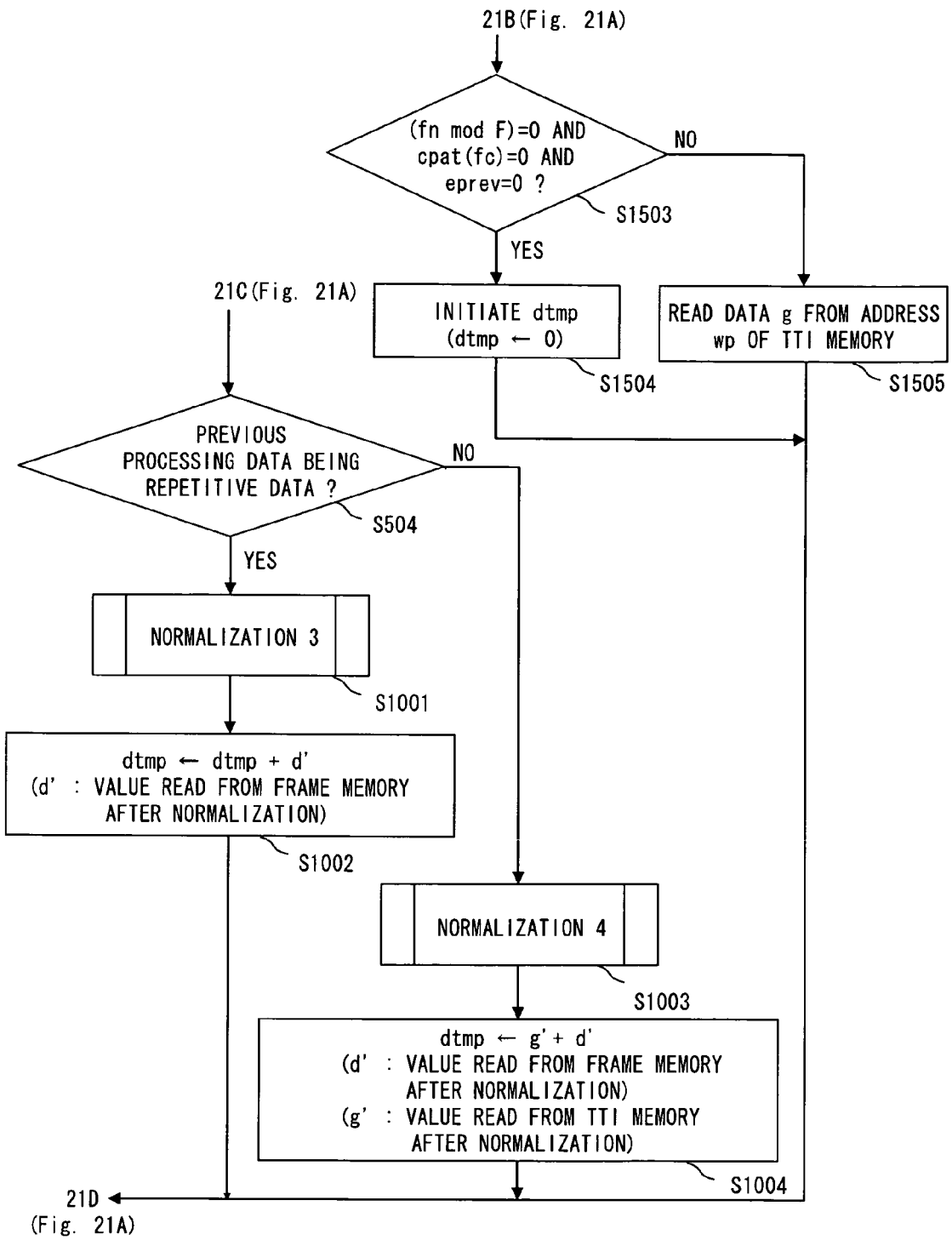
FIG. 21B is also a flowchart showing receiving-end data deletion processing performed in the de-rate matching circuit according to the fifth exemplary embodiment of the present invention.
Figure 21C:
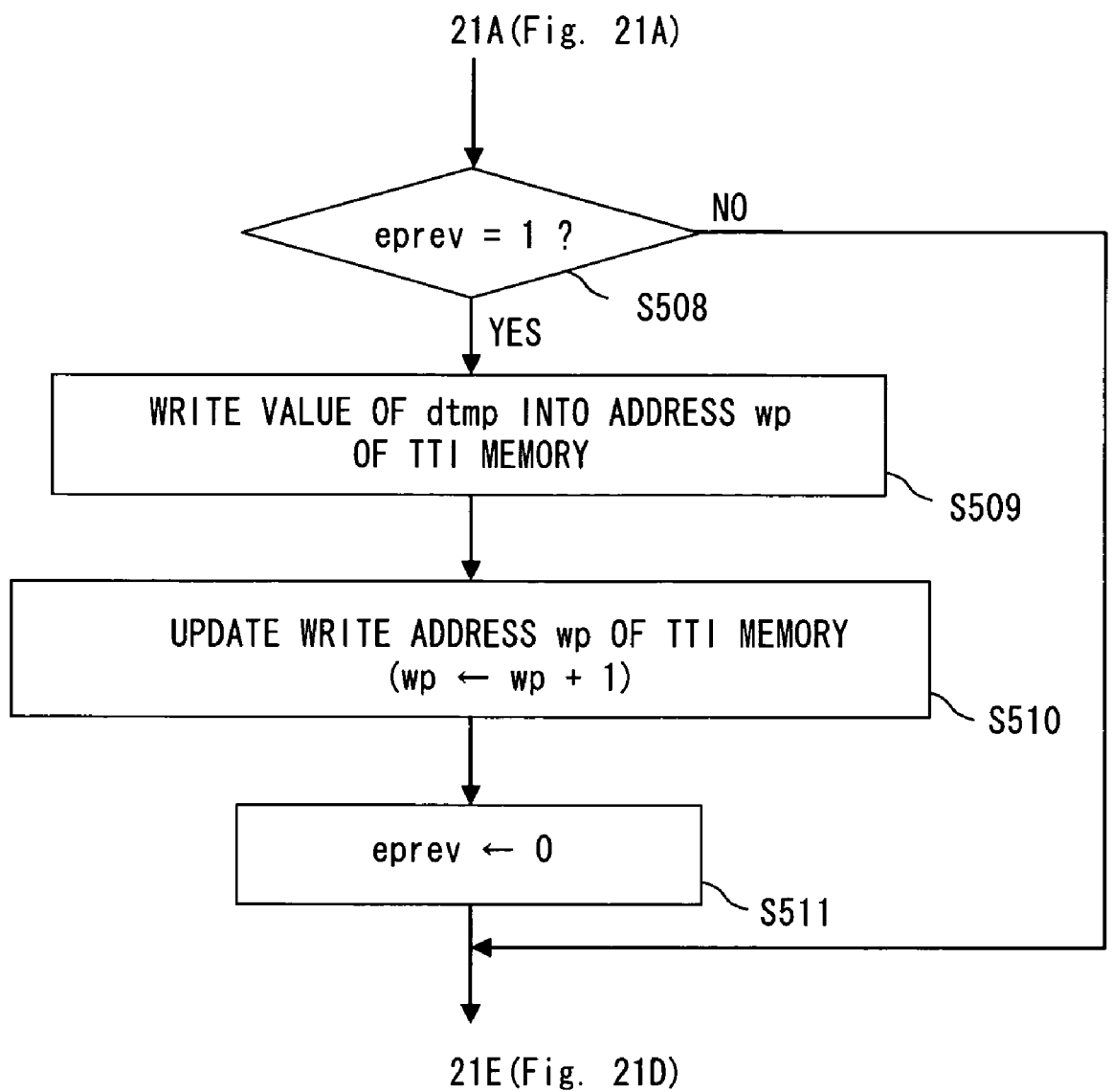
FIG. 21C is also a flowchart showing receiving-end data deletion processing performed in the de-rate matching circuit according to the fifth exemplary embodiment of the present invention.
Figure 21D:
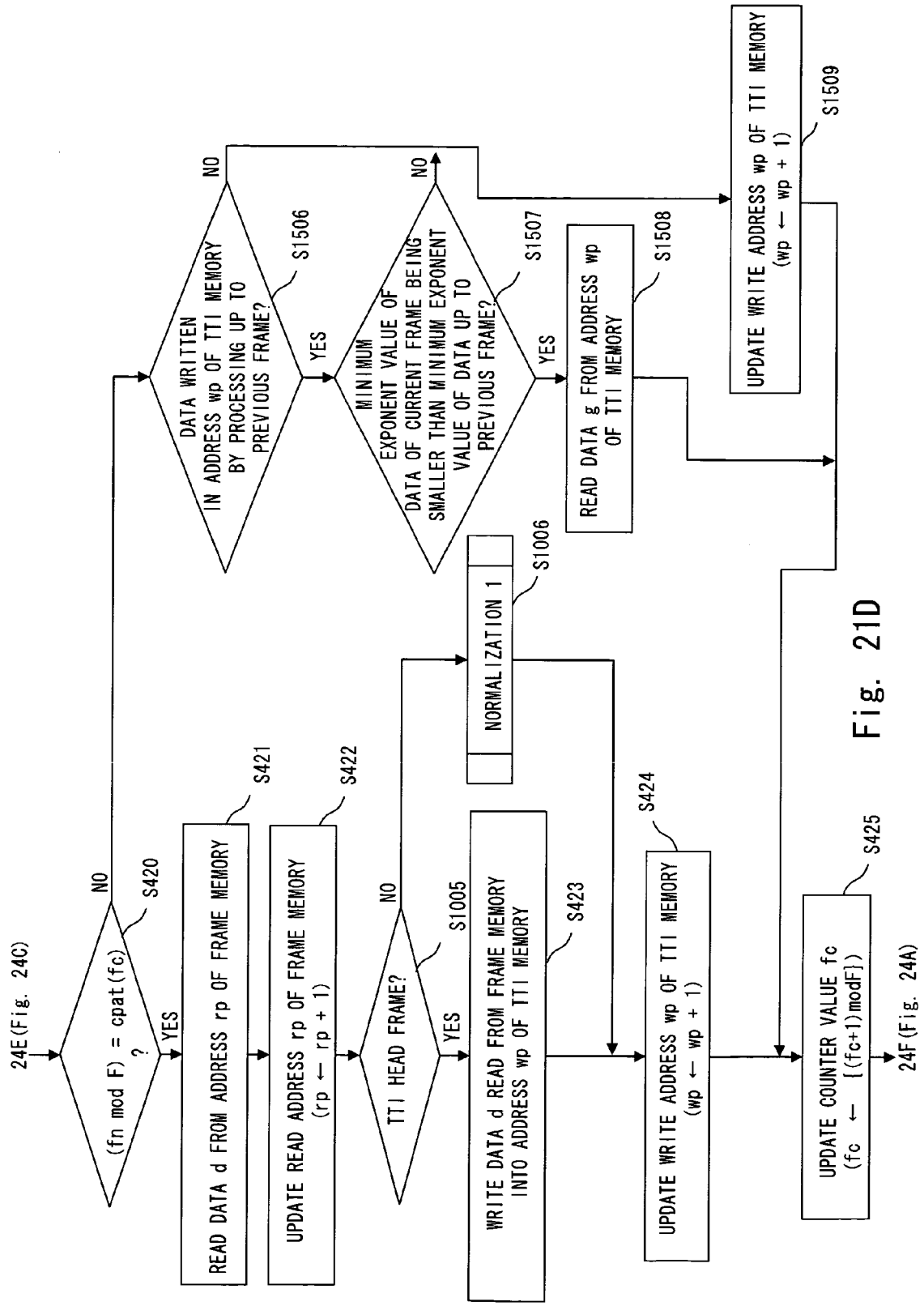
FIG. 21D is also a flowchart showing receiving-end data deletion processing performed in the de-rate matching circuit according to the fifth exemplary embodiment of the present invention.
Figure 22:
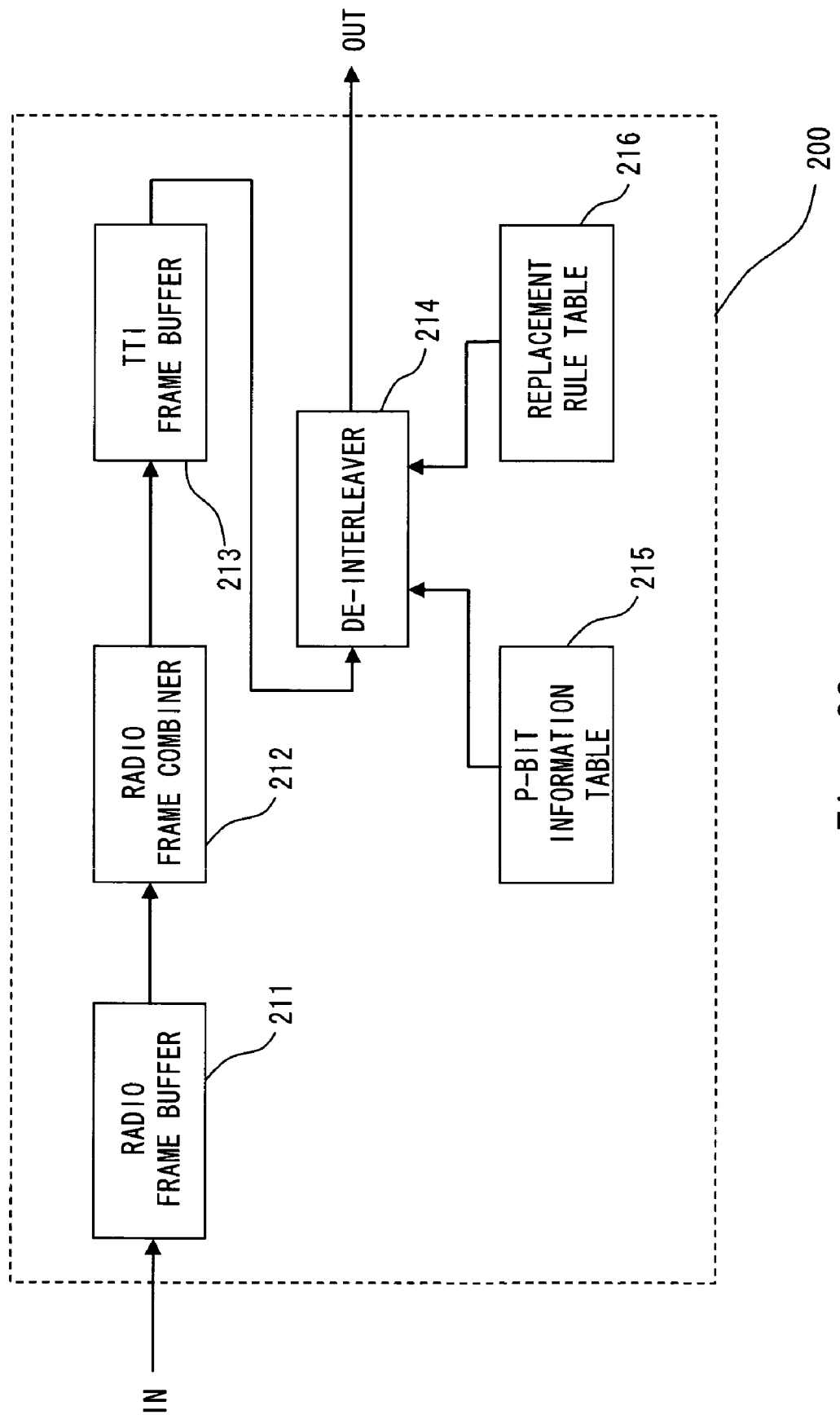
FIG. 22 is a view showing the configuration of a de-interleaving device 200 disclosed in Japanese Unexamined Patent Application Publication No. 2006-14000.

FIGS. 21A and 21B are flowcharts showing the method of the receiving-end data deletion processing according to the fifth exemplary embodiment of the present invention. Referring to FIGS. 21A and 21B, the steps S1501 to S1509, which are different from the exemplary embodiments described earlier, are performed in the fifth exemplary embodiment.

The step S1501 is performed after the initialization of the parameters is completed (S401). In the step S1501, it is determined whether data is read from the TTI memory 16 in the previous processing. If it is determined in the step S1501 that the data is read from the TTI memory 16 in the previous processing (Yes in S1501), the normalization 5 is performed (S1502). After the normalization 5 ends, the variable e is decremented by $e_{minus}$ in the step S402. The normalization 5 is the same processing as the above-described normalization 5. The normalization 5 is thus not repeatedly described. On the other hand, if it is determined in the step S1501 that the data is not read from the TTI memory 16 in the previous processing (No in S1501), the process proceeds to the step S402 without performing the normalization 5.

The step S1503 is a step that replaces the step S502. In the step S1503, it is determined whether the frame number of the current processing frame is 0, the processing target frame number of the first de-interleaving pattern cpat (fc) is 0, and the eprev indicating the previous error counter status is 0. If the conditions of the step S1503 are satisfied (Yes in S1503), the step S1504 is performed. The step S1504 corresponds to the processing of the step S503, which initializes the temporary storage register dtmp to 0. On the other hand, if the conditions of the step S1503 are not satisfied (No in S1503), the step S1505 is performed. In the step S1505, the data g is read from the address wp of the TTI memory 16. By this reading, it is possible to eliminate the need to access the TTI memory 16 (S506), which has been performed before the normalization 4.

The step S1506 is performed if it is determined in the step S420 that the frame being processed is not a frame to be currently processed (No in S420). In the step S1506, it is determined whether the processing data up to the previous frame is written to the address wp of the TTI memory 16. If it is determined in the step S1506 that the processing data up to the previous frame is written to the address wp of the TTI memory 16 (Yes in S1506), the step S1507 is performed. In the step S1507, it is determined whether the minimum exponent value of the data of the current frame is smaller than the minimum exponent value of the data up to the previous frame. If it is determined in the step S1507 that the minimum exponent value of the data of the current frame is smaller than the minimum exponent value of the data up to the previous frame (Yes in S1507), the process proceeds to the step S1508. In the step S1508, the data g is read from the address wp of the TTI memory 16. After the step S1508, the process proceeds to the step S425. On the other hand, if it is determined in the step S1506 that the processing data up to the previous frame is not written in the address wp of the TTI memory 16 (No in S1506), and if it is determined in the step S1507 that the minimum exponent value of the data of the current frame is equal to or larger than the minimum exponent value of the data up to the previous frame (No in S1507), the process executes the step S1509. In the step S1509, the write address wp of the TTI memory 16 is updated (e.g. wp←wp+1). After the step S1509, the process proceeds to the step S425.

As described above, the receiving-end data deletion processing also includes the normalization 5 (S1501, S1502) and the steps S1506 to S1509 that correspond to the normalization 5 (S1301, S1302) and the steps S1303 to S1306 in the receiving-end data insertion processing. Therefore, it is possible to make an access to the TTI memory 16 simultaneously in the normalization 1 and the normalization 5 in the receiving-end data deletion processing as well. Further, with the steps S1503 to S1505 in the receiving-end data deletion processing, it is possible to reduce the number of times to access the TTI memory 16.

In the case where a general memory (e.g. a single port memory) is used as the TTI memory 16, two times of accesses (i.e. reading and writing) to normalization target data stored in the TTI memory occur in one data processing of the de-rate matching. Further, writing of data read from the frame memory may also occur. Therefore, a time required for one data processing can be two cycles or longer. This causes an increase in processing time and power consumption in the case of using a single port memory as the TTI memory. Although the use of a simultaneously accessible dual port memory enables simultaneous access, it increases the LSI area.

In light of this, the TTI memory is composed of a plurality of banks according to the fifth exemplary embodiment. This eliminates conflicts among reading and writing of data from/ to the TTI memory and writing of data read from the frame memory, thereby enabling performing one data processing in one cycle.

As described in the foregoing, because the TTI memory 16 includes a plurality of banks according to the fifth exemplary embodiment, it is possible to perform writing and reading of a plurality of data simultaneously to different addresses of the TTI memory 16. Further, in such a configuration of the TTI memory 16, by accessing the TTI memory 16 during the de-rate matching according to the timings shown in the process flow described above, it is possible to reduce the number of times to access the TTI memory 16. The reduction of the number of times to access the TTI memory 16 enables an increase in the processing speed and a decrease in power consumption.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

For example, the de-rate matching circuit 13 may be placed in the subsequent stage of the first de-interleaver 14, as long as it is placed in the stage previous to the TTI memory 16. Although the hardware configuration is described in the above exemplary embodiments, it is not limited thereto, and arbitrary processing may be implemented by causing a central processing unit (CPU) to execute a computer program. In such a case, the computer program may be provided by being recorded in a recording medium or transmitted through a transmission medium such as the Internet.

What is claimed is:

1. A receiving circuit comprising:
   a frame memory to store received data of one frame among received data that is divided into frames after rate-matching at a transmitting end;
   a de-rate matching circuit to generate data before decoding by reading the received data from the frame memory and performing de-rate matching in a reverse manner to the rate-matching performed on the received data at the transmitting end;
   a first de-interleaver that de-interleaves the frame data received from the de-rate matching circuit;
   a radio frame combiner that combines the de-interleaved frame data with another frame data to form a transport channel; and
   a TTI memory to store the data before decoding from the radio frame combiner.

2. The receiving circuit according to claim 1, further comprising:
   the first de-interleaver placed between the de-rate matching circuit and the TTI memory, to store data into the TTI memory according to a first de-interleaving pattern indicating a row interchange pattern, wherein the de-rate matching circuit determines whether to perform the de-rate matching on data being processed based on the first de-interleaving pattern and a frame number of the data being processed.

3. The receiving circuit according to claim 1, wherein the de-rate matching circuit includes a temporary storage register to store a repetitive data integration result in receiving-end data deletion processing, to eliminate repetitive data from the received data when receiving the received data on which data repetitive insertion processing has been performed at the transmitting end.

4. The receiving circuit according to claim 1, wherein when receiving the received data on which data elimination processing has been performed at the transmitting end, the de-rate matching circuit inserts puncture data as a complement to data eliminated by the data elimination processing into a TTI head frame only.

5. The receiving circuit according to claim 1, further comprising:

a normalizer placed in a subsequent stage of the de-rate matching circuit, to normalize data contained in the received data between frames.

6. The receiving circuit according to claim 1, wherein the TTI memory includes a plurality of banks or a plurality of memories being simultaneously accessible.

7. The receiving circuit according to claim 1, further comprising:

the radio frame combiner to form a TTI frame by sequentially combining data output from the de-rate matching circuit via the first de-interleaver, and store the TTI frame into the TTI memory as the data before decoding.

8. The receiving circuit according to claim 1, further comprising:

a decoder to decode the data before decoding stored in the TTI memory.

9. The receiving circuit according to claim 1, wherein the de-rate matching circuit adds data read from the TTI memory to the received data read from the frame memory to form write data, and wherein the write data is written to the TTI memory.

10. The receiving circuit according to claim 3, wherein the TTI memory stores undecoded data resulting from the repetitive data integration.

11. The receiving circuit according to claim 1, wherein the TTI memory stores undecoded data used for decoding.

12. The receiving circuit according to claim 1, wherein the transport channel comprises undecoded data, which is stored in the ITT memory.

13. The receiving circuit according to claim 8, wherein the decoder retrieves the data stored in the TTI memory before decoding the retrieved data.

14. The receiving circuit according to claim 1, wherein the received data is divided into frames after rate-matching at the transmitting end and before being stored by the frame memory.

15. The receiving circuit according to claim 1, further comprising a second de-interleaver that is provided upstream of the frame memory, the second de-interleaver dividing the received data into frames after rate-matching on the transmitting side.

* * * * *